(12) United States Patent
Balakrishnan et al.

(10) Patent No.: US 7,610,539 B2
(45) Date of Patent: Oct. 27, 2009

(54) METHOD AND APPARATUS FOR TESTING LOGIC CIRCUIT DESIGNS

(75) Inventors: Kedarnath Balakrishnan, Princeton, NJ (US); Seongmoon Wang, Plainsboro, NJ (US); Wenlong Wei, Mercerville, NJ (US); Srimat T. Chakradhar, Manalapan, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 0 days.

(21) Appl. No.: 12/265,330

(22) Filed: Nov. 5, 2008

(65) Prior Publication Data

US 2009/0119556 A1    May 7, 2009

Related U.S. Application Data

(62) Division of application No. 11/538,245, filed on Oct. 3, 2006, now Pat. No. 7,484,151.

(60) Provisional application No. 60/723,036, filed on Oct. 3, 2005, provisional application No. 60/743,487, filed on Mar. 15, 2006, provisional application No. 60/743,359, filed on Feb. 27, 2006.

(51) Int. Cl.
*G06F 11/00* (2006.01)
*G01R 31/28* (2006.01)

(52) U.S. Cl. .................. 714/738; 714/729; 714/744

(58) Field of Classification Search ............. None
See application file for complete search history.

(56) References Cited

U.S. PATENT DOCUMENTS 5,982,682 A   11/1999  Nevill et al.
5,991,904 A   11/1999  Duesman
6,041,429 A * 3/2000  Koenemann .............. 714/738
6,327,687 B1  12/2001  Rajski et al.
6,543,020 B2  4/2003   Rajski et al.
6,728,654 B2  4/2004   Boehm
6,807,646 B1* 10/2004  Williams et al. .......... 714/736
6,950,974 B1* 9/2005   Wohl et al. ............... 714/733
2002/0093356 A1* 7/2002 Williams et al. .......... 324/765
2002/0095623 A1* 7/2002 Bruce ...................... 714/42
2006/0015787 A1  1/2006 Wang et al.
2006/0101316 A1  5/2006 Wang et al.
2006/0112320 A1  5/2006 Balakrishnan et al.

OTHER PUBLICATIONS

Konemann, B., "LFSR-Coded Test Patterns for Scan Designs", Proc. of the European Test Conference, pp. 237-242, 1991.

(Continued)

*Primary Examiner*—Christine T Tu
(74) *Attorney, Agent, or Firm*—Joseph J. Kolodka

(57) ABSTRACT

Disclosed is a logic testing system that includes a decompressor and a tester in communication with the decompressor. The tester is configured to store a seed and locations of scan inputs and is further configured to transmit the seed and the locations of scan inputs to the decompressor. The decompressor is configured to generate a test pattern from the seed and the locations of scan inputs. The decompressor includes a first test pattern generator, a second test pattern generator, and a selector configured to select the test pattern generated by the first test pattern generator or the test pattern generated by the second test pattern generator using the locations of scan inputs.

9 Claims, 16 Drawing Sheets

OTHER PUBLICATIONS

Al-Yamani, A. et al., "Seed Encoding with LFSRs and Cellular Automata", Proc. of the 40th Conference on Design Automation, pp. 560-565, 2003.

Krishna, C.V. et al., "Reducing Test Data Volume Using LFSR Reseeding with Seed Compression", Proc. of the IEEE International Test Conference (ITC), pp. 321-330, 2002.

* cited by examiner

FIG. 3C $$\begin{bmatrix} 1 & 0 & 0 & 0 & 1 & 0 & 0 & 0 \\ 0 & 1 & 0 & 0 & 0 & 0 & 1 & 0 \\ 0 & 0 & 1 & 0 & 0 & 1 & 0 & 0 \\ 0 & 0 & 0 & 1 & 0 & 0 & 1 & 0 \\ 0 & 1 & 0 & 0 & 0 & 0 & 0 & 1 \end{bmatrix} \begin{bmatrix} X_1 \\ X_2 \\ X_3 \\ X_4 \\ X_5 \\ X_6 \\ X_7 \\ X_8 \end{bmatrix} = \begin{bmatrix} 1 \\ 0 \\ 1 \\ 0 \\ 1 \end{bmatrix}$$

EQUATIONS FOR PATTERN $p_i$

| ENTRY | | | | |
|---|---|---|---|---|
| 1 | 1 | 0 | 1 | 1 |
| 2 | 0 | 1 | 0 | 1 |
| 3 | 1 | 0 | 0 | 0 |
| 4 | 0 | 0 | 1 | 0 |
| 5 | 1 | 1 | 0 | 0 |

DICTIONARY — 340

FIG. 3D $$\begin{bmatrix} X_1 \\ X_2 \\ X_3 \\ X_4 \\ X_8 \end{bmatrix} = \begin{bmatrix} 1 \\ 0 \\ 1 \\ 0 \\ 1 \end{bmatrix} \oplus \begin{bmatrix} 1 & 0 & 0 \\ 0 & 0 & 1 \\ 0 & 1 & 0 \\ 0 & 0 & 1 \\ 0 & 0 & 1 \end{bmatrix} \begin{bmatrix} X_5 \\ X_6 \\ X_7 \end{bmatrix}$$

| ENTRY — 350 | | | | | ENTRY — 355 | | | | | LFSR1 | LFSR2 | ALL |
|---|---|---|---|---|---|---|---|---|---|---|---|---|
| 1 | 1 | 0 | 1 | 1 | 1 | 1 | 0 | 1 | 1 | (2,0) | (0,2) | (2,0) |
| 2 | 0 | 1 | 0 | 1 | 2 | 0 | 1 | 0 | 1 | (3,0) | (0,4) | (3,0) |
| 3 | 1 | 0 | 0 | 0 | 3 | 1 | 0 | 0 | 0 | (4,0) | | (4,0) |
| 4 | 0 | 0 | 1 | 0 | 4 | 0 | 0 | 1 | 0 | | | (0,2) |
| 5 | 1 | 1 | 0 | 0 | 5 | 1 | 1 | 0 | 0 | | | (0,4) |
| | | | | | | | | | | | | (3,2) |

LFSR1 ($X_1 X_2 X_3 X_4$)  LFSR2 ($X_5 X_6 X_7 X_8$)

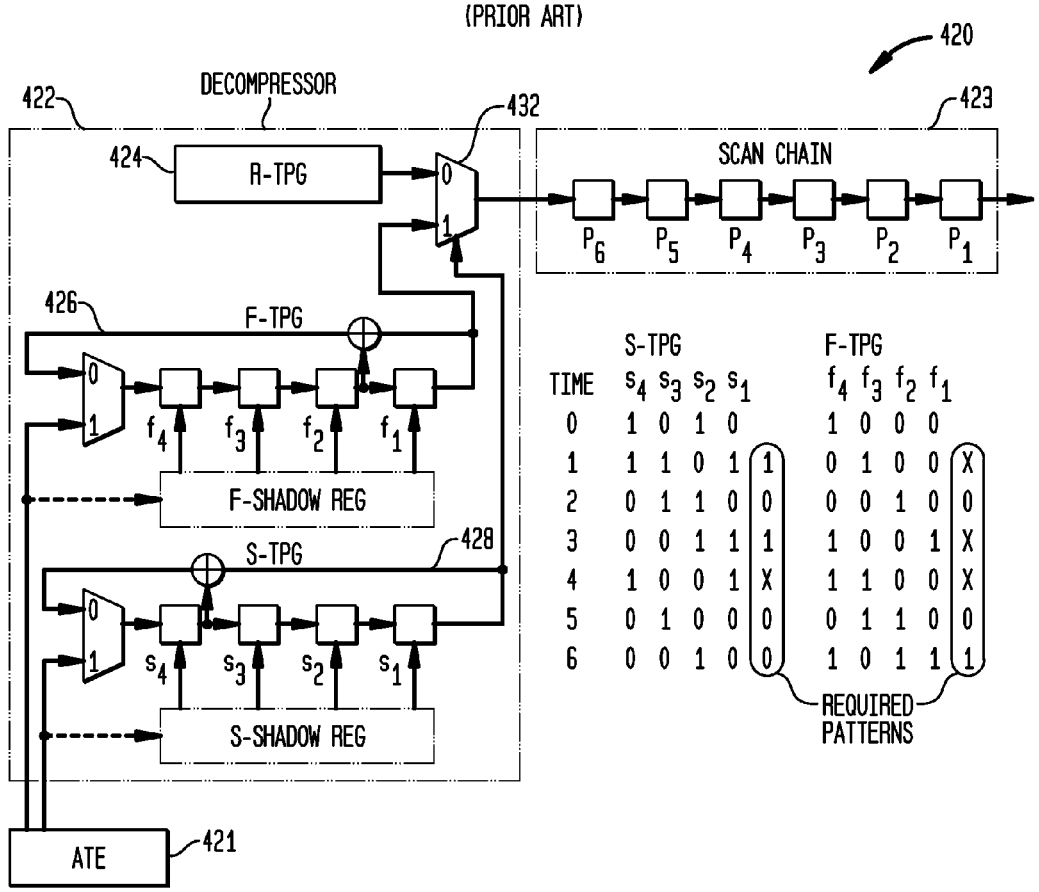

|  |  | ... $P_h,224$ | $P_h,223$ | ... | $P_h,13$ | $P_h,12$ ... |
|---|---|---|---|---|---|---|
| 1308 — $d^a$ | $CHAIN_1$ | ... 0 | X | ... | X | X ... |
|  | $CHAIN_2$ | ... 1 | X | ... | X | X ... |
|  | ⋮ |  |  | ⋮ |  |  |
|  | $CHAIN_B$ | ... X | X | ... | 0 | X ... |
| 1304 — $d^b$ | $CHAIN_1$ | ... 1 | X | ... | 1 | X ... |
|  | $CHAIN_2$ | ... X | X | ... | X | X ... |
|  | ⋮ |  |  | ⋮ |  |  |
|  | $CHAIN_B$ | ... X | X | ... | X | X ... |
| 1302 — $G^k$ | $CHAIN_1$ | ... U | X | ... | 1 | X ... |
|  | $CHAIN_2$ | ... Ⓤ | X | ... | X | X ... |
|  | ⋮ |  |  | ⋮ |  |  |
|  | $CHAIN_B$ | ... X | X | ... | 0 | X ... |

METHOD AND APPARATUS FOR TESTING LOGIC CIRCUIT DESIGNS

This application claims the benefit of U.S. Provisional Application No. 60/723,036 filed Oct. 3, 2005, U.S. Provisional Application No. 60/743,487 filed Mar. 15, 2006, and U.S. Provisional Application No. 60/743,359 filed Feb. 27, 2006, all of which are incorporated herein by reference. This application is a Divisional Application of copending patent application Ser. No. 11/538,245, filed Oct. 3, 2006, which is incorporated herein by reference.

BACKGROUND OF THE INVENTION

The present invention is related to testing of logic circuit designs, and in particular to the decompression of test results of logic testing and decompression of test results of the logic testing.

Testing of complex digital logic circuits requires the generation of a large number of test patterns. Unfortunately, the sizes of scan test patterns for today's large designs can be even larger than the sizes of a typical tester (i.e., an automated test equipment (ATE)) memory. This necessitates multiple loading of test patterns during a test application and, in turn, increases test application time and test cost. The oversized test pattern set problem is even more severe in delay testing, which has become a necessary test procedure for deep-sub micron chips. Delay test set sizes are often significantly larger than memory capacities of inexpensive testers. Test set sizes and test application times are major factors that determine the test cost of an integrated circuit.

One technique for addressing the issue is to compress the test data. Most prior art test data compression techniques proposed and developed for commercial use achieve compression by storing the seeds of a linear test pattern generator (e.g., such as a linear feedback shift register (LFSR) or a linear hybrid cellular automata (LHCA)) instead of the whole pattern.

The test pattern is generated from the seed by first loading the seed and then running the linear test pattern generator for several cycles. The seeds are obtained by solving a system of linear equations. Compression is achieved because many of the bits in the test patterns are, in fact, unspecified ("don't cares"). FIG. 1 shows the architecture of typical reseeding schemes, where a linear test pattern generator 104 is loaded with an m-bit seed by the tester and is then run in autonomous mode to produce a scan chain pattern to fill scan chain 108. The generator can be directly connected to the scan chain in the case of a single scan chain in the design or connected to multiple scan chains using a phase shifter 112.

In one LFSR reseeding scheme, the compression obtained is limited by the worst case scenario (i.e., the most specified scan test pattern). This is because, in order to be able to compress all the scan test patterns in the test set, the size of the LFSR is traditionally 20 more than the maximum number of specified bits $S_{max}$ amongst all scan test patterns. However, most scan test patterns have much fewer specified bits than $S_{max}$, and a smaller seed will be enough to generate them. Hence, the efficiency is reduced by using the worst case seed size for the scan test patterns.

Compression schemes that are independent of an automatic test pattern generator (ATPG), usually based on coding theory, have the disadvantage that the design of the decompressor is dependent on the actual test patterns. Any changes in the test patterns (e.g., due to last minute design changes), will require the decompressor to be redesigned. On the other hand, compression schemes based on LFSR reseeding, though not fully independent of ATPG (i.e., not applicable with any scan test patterns), can be thought of as almost independent since typically the only requirement is on the $S_{max}$ of the generated scan test patterns. Any ATPG can be used to generate the scan test patterns, and as long as the $S_{max}$ of the patterns is less than a particular number, these schemes can be used to compress the scan test patterns without any loss in fault coverage.

For compression schemes that utilize only the unspecified bits in the scan test patterns, the maximum compression will still be limited by the total specified bits. For typical values of specified bits (e.g., 1% to 2%), the maximum compression that can be achieved is typically 50 times-100 times. To get higher compression, schemes that combine current techniques with another level of compression is required. Higher compression is often useful with the scaling of technology. In particular, more test patterns can be generated, and more fault models accommodated, especially to cover the new defects.

Therefore, there remains a need to more efficiently test logic circuit designs.

BRIEF SUMMARY OF THE INVENTION

In accordance with an aspect of the present invention, a logic testing system includes a decompressor and a tester in communication with the decompressor. The tester is configured to store a seed and locations of scan inputs and is further configured to transmit the seed and the locations of scan inputs to the decompressor. The decompressor is configured to generate a test pattern from the seed and the locations of scan inputs. The decompressor includes a first test pattern generator configured to generate a random test pattern and a second test pattern generator configured to generate a test pattern from the seed. The decompressor also includes a selector configured to select the random test pattern or the test pattern using the locations of scan inputs.

In one embodiment, the selector includes a FIFO buffer configured to store the locations of scan inputs, a counter configured to count to a predetermined number, and a comparator configured to transmit a first predetermined value when output of the FIFO buffer equals the output of the counter and configured to transmit a second predetermined value when output of the FIFO buffer does not equal the output of the counter.

Another aspect of the present invention includes a method for generating, from a test cube set, a generator configured to generate multiple test patterns for testing a circuit. The method includes fault simulating the circuit with at least one test cube in the test cube set and selecting a test cube that has the largest number of faults in a target fault list. At least one bit in the selected test cube is relaxed, and the selected test cube is then moved to a current test cube subset. The current test cube subset is then used to generate the generator. A decompressed test pattern is then generated from the generator. The circuit is fault simulated with the decompressed test pattern and at least one fault (i.e., the result of the fault simulation) is then dropped. Additional bits in the selected test cube are then relaxed after dropping the at least one fault.

In yet another aspect of the invention, a logic testing system includes test pattern generators, each of which has a plurality of stages and is configured to generate test patterns for one or more scan chains. The logic testing system also includes a phase shifter having a plurality of exclusive OR (XOR) gates and in communication with the one or more scan chains and the plurality of test pattern generators. One stage of each of the test pattern generators is connected to each XOR gate of the phase shifter. At least a portion of stages of at least a portion of test pattern generators is seeded. The test pattern generators that are seeded can depend on a number of specified bits in a test pattern.

These and other advantages of the invention will be apparent to those of ordinary skill in the art by reference to the following detailed description and the accompanying drawings.

BRIEF DESCRIPTION OF THE DRAWINGS

FIG. 3C is a diagram of linear equations for a scan load pattern and an associated dictionary in accordance with an embodiment of the present invention;

FIG. 3D is a diagram of a solution to the linear equations shown in FIG. 3C in accordance with an embodiment of the present invention;

FIG. 3E is a diagram of matching dictionary entries in accordance with an embodiment of the present invention;

FIG. 4A is a diagram of a generator that is computed from a set of four test cubes in accordance with an embodiment of the present invention;

FIG. 4B is a block diagram of a prior art decompression system for the generator shown in FIG. 4A;

FIG. 7 illustrates a circuit for dividing specified bits in a test cube into two test cubes via a test pattern uncompaction technique in accordance with an embodiment of the present invention;

FIG. 13 is a diagram illustrating a test cube subset and corresponding generator in accordance with an embodiment of the present invention.

DETAILED DESCRIPTION

Figure 2A:
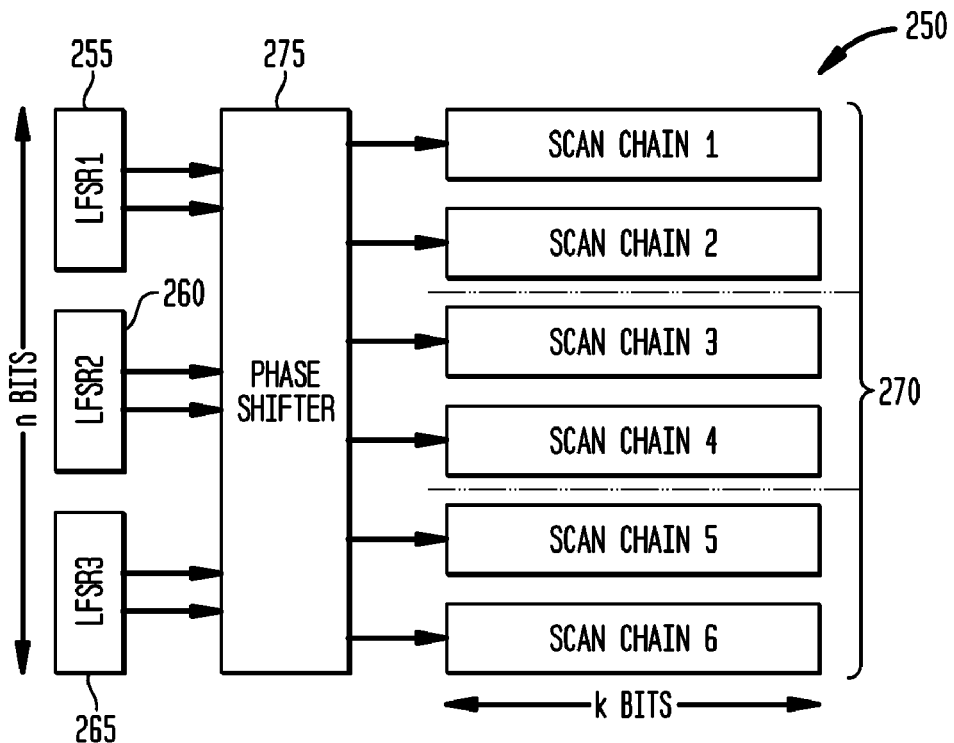
FIG. 2A is a block diagram of a decompressor where three LFSRs are connected to scan chains using a phase shifter in accordance with an embodiment of the present invention.

FIG. 2A is a block diagram of an embodiment of a decompressor 250 where three LFSRs 255, 260, 265 connected to scan chains 270 using a phase shifter 275. The sum of the stages of the LFSRs 255, 260, 265 is equal to $S_{MAX}+M$, where $S_{MAX}$ is the maximum number of specified bits in any test cube (a test pattern with unspecified (also referred to below as "don't care" bits) and M is a margin to ensure that the equations to solve for the seeds are solvable (usually 20 or more). In one embodiment, each LFSR 255, 260, 265 can be independently loaded by a tester. Depending on the specified bits in each scan load pattern, one or more of the LFSRs 255, 260, 265 is reseeded. Hence, the tester also needs to store the number of LFSRs 255, 260, 265 to be reseeded for each scan load pattern.

The phase shifter 275 is used in typical LFSR reseeding schemes to remove the dependency between the different LFSR stages. In one embodiment, even though the dependency is reduced (since LFSRs can be loaded independently), the phase shifter 275 has to perform an important function. The phase shifter 275 has to ensure that specified bits in any scan chain can be generated even when the LFSRs are not reseeded. For example, suppose that, in FIG. 2A, n=300 and each LFSR 255, 260, 265 is the size 100. Further, for some pattern $p_i$, the number of specified bits, $s_i$, is 50 and potentially only one LFSR needs to be reseeded to generate that pattern. However, if one of the specified bits is in scan chain 6 and there is no way for any seed loaded into LFSR1 255 to reach scan chain 6 (because of the phase shifter connections), then $p_i$ cannot be generated by just reseeding LFSR1 255. Hence the phase shifter 275 has to ensure that the input of every scan chain depends on at least one stage of each LFSR. This means that, irrespective of which scan chain the scan flip-flop corresponding to a specified bit in the scan load pattern belongs to, the linear equations for that pattern will have at least one variable which is reseeded.

Figure 2B:
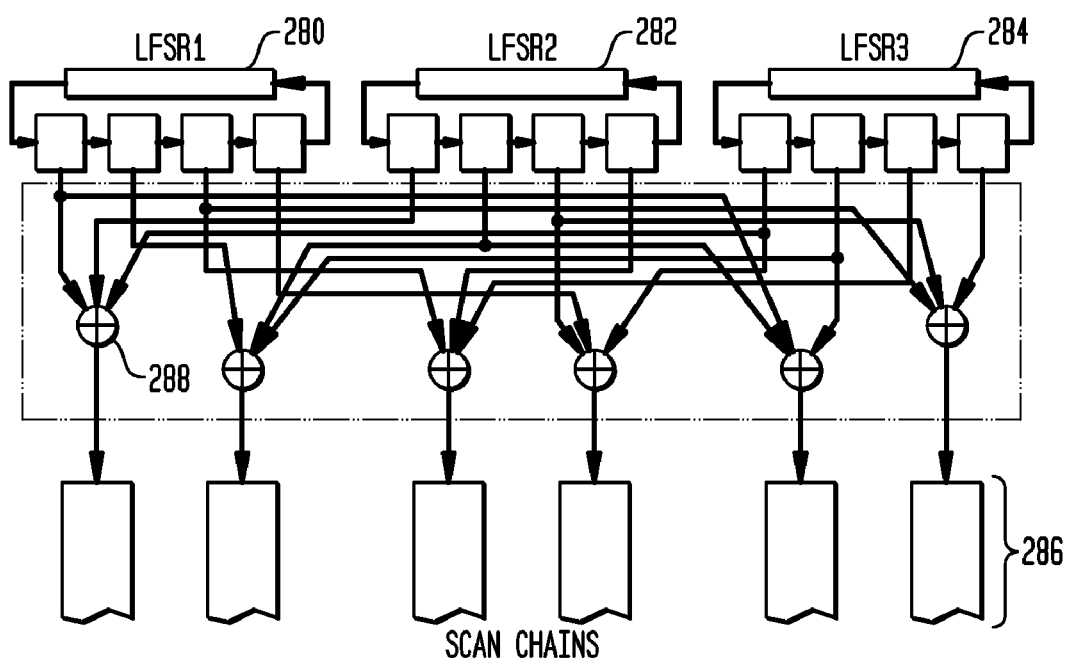
FIG. 2B is a block diagram of three LFSRs connected to six scan chains in accordance with an embodiment of the present invention.

An example phase shifter that satisfies the above conditions is shown in FIG. 2B, where three LFSRs (i.e., LFSR1 280, LFSR2 282, and LFSR3 284) of four stages each are connected to six scan chains 286. Each of the scan chains 286 has one input from each of the LFSRs 280, 282, 284, and hence the values in any scan flip-flop can be generated by reseeding a LFSR. Each phase shifter may be an XOR (e.g., XOR 288) of three or four LFSR stages. However, if the number of LFSRs 280, 282, 284 is higher than to maintain the phase shifter area, not all LFSRs 280, 282, 284 can be connected into each scan chain input. This can affect the compression since a higher number of LFSRs may need to be reseeded to generate some scan load patterns.

For circuits with multiple clock domains, delay test patterns are generated and applied one clock domain at a time. The flip-flops belonging to a clock domain are usually tied to the same scan chain. Hence the scan chains can be partitioned into different clock domains or groups of clock domains. Consider, for example, in FIG. 2A, that the circuit 250 has three clock domains and scan chains 1 and 2 are connected to clock domain CLK1 and scan chains 3 and 4 are connected to clock domain CLK2 and scan chains 5 and 6 are connected to clock domain CLK3. When delay patterns are generated one clock domain at a time, the values in scan flip-flops corresponding to other domains in scan load patterns are unspecified. Hence, for a delay test pattern, only the corresponding LFSR needs to be reseeded.

The LFSRs can be sized based on the actual scan load patterns to get even higher encoding efficiency. However, pattern independence is assumed and an estimate of the maximum number of specified bits, $S_{MAX}$, is used. The number of stages of the LFSRs are assumed to be the same, depending on the total stages (($n=S_{MAX}+M$)) and the number of LFSRs.

Encoding Algorithm

An embodiment of the algorithm to encode the scan load pattern using multiple LFSRs is below. For each scan load pattern, the number of LFSRs to be reseeded, r, is determined by the number of specified bits in that pattern. Equations are formed for reseeding the first r LFSRs and using the current state of the other LFSRs. The equations can be solved using Gaussian Elimination. The seeds for the reseeded LFSR are stored along with the number of reseeded LFSRs as the compressed set.

Algorithm 1: Encoding Scan Patterns
1) P={all scan load patterns}
2) k=Number of LFSRs
3) l=Number of stages in each LFSR
4) for each pattern p∈P{
5) $s_p$=specified bits in p;
6) r=|($s_p$+20)/l|
7) //r-# of LFSRs to be reseeded
8) eqns=FORM_EQUATIONS(p,r,l);
9) seeds(r)=SOLVE_EQUATIONS(eqns);
10) STORE(r, seeds(r)) for p;}

The above algorithm assumes that each scan load pattern is encoded separately and the patterns cannot be reordered. Note that reordering the patterns does not modify the compression of the above algorithm as long as each pattern is encoded separately. If this restriction is removed, then patterns can be reordered to improve the compression.

Reordering and Multiple Pattern Encoding

By encoding multiple patterns together, the efficiency can be improved further. Patterns can be reordered such that those with very few specified bits are together. A multiple LFSR scheme has the advantage of smaller reseeding resolution which may lead to higher compression.

Figure 3A:
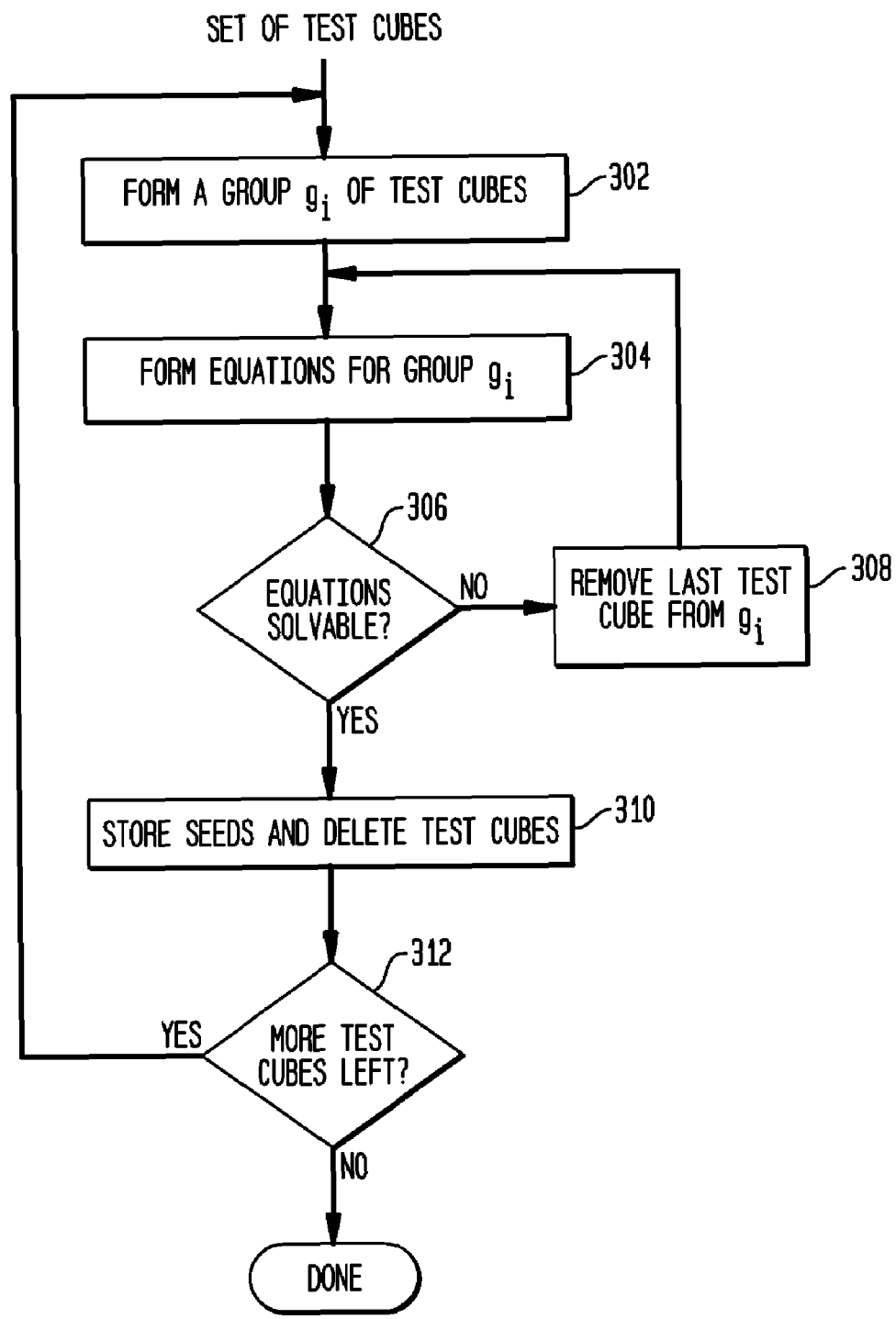
FIG. 3A is a flowchart of the steps performed for multiple pattern encoding in accordance with an embodiment of the present invention.

An algorithm to form groups of patterns is described in FIG. 3A. The first pattern in a group is the scan load pattern remaining that has the maximum specified bits. For the first pattern in the group, all the LFSRs will be reseeded. Patterns are added into the group that satisfy the following criteria. Patterns that can be generated without reseeding any additional LFSR are added first. If such patterns don't exist, then patterns that can be generated by reseeding only one additional LFSR are added and so on until either the total number of equations exceeds a predetermined limit or no more patterns can be added without reseeding the LFSRs.

FIG. 3A is a flowchart of the steps performed for multiple pattern encoding. A group $g_i$ of test cubes is formed from a set of test cubes in step 302. Equations for each group are then formed in step 304. It is then determined whether the equations are solvable in step 306. If the equations are not solvable, the last test cube is removed from $g_i$ in step 308. This possibility is due to the fact that the algorithm to group patterns only utilizes the number of specified bits and not the position of specified bits. The process then returns to step 304. If the equations are solvable, the seeds are stored and the test cubes are deleted in step 310. If more test cubes are left in step 312, the process returns to step 302. Otherwise, the process is finished.

Dictionary Encoding of Seeds

A second level of compression may also be used to increase the efficiency of LFSR reseeding schemes. Using multiple LFSRs is advantageous for second level compression since the LFSR sizes are smaller, the number of seeds is higher, and therefore the probabilities of matching seeds increase. Dictionary based compression schemes are commonly used in data compression. A dictionary stores symbols that can be accessed by an index much smaller than the symbol size and can be constructed either statically or dynamically. In static dictionaries, the entries remain constant and are finalized during encoding. Decoding is done by looking up the dictionary entry using the index. In dynamic or adaptive dictionaries, the entries change during the encoding and decoding procedures and need not be stored separately. The encoding and decoding procedures for adaptive dictionaries are complex and usually implemented in software, e.g., the UNIX compression program gzip which uses Lempel-Ziv based encoding.

In one embodiment, the dictionary based compression scheme is implemented in hardware using either a memory (RAM) or combinational logic. To keep the hardware independent of the pattern set, memory has to be used and the size of the dictionary typically has to be decided beforehand. If the length of the index is $l_{ind}$, then a maximum of $D+2^{l}ind$ entries can be stored in the dictionary. If the number of unique LFSR seeds is more than D, then the seeds cannot be encoded using the dictionary. In one embodiment, a subset of the seeds is stored in the dictionary. For the rest of the seeds, the dictionary is bypassed and the seeds are directly stored. In these cases, an additional bit may be required for each encoded word to indicate whether it is coded data (index of the dictionary) or not. In one embodiment, since the hardware overhead of the dictionary depends on the number of entries, $l_{ind}$ is set to be as small as possible to minimize the hardware overhead. In one embodiment, a seed is encoded as a function of one or more previous seeds.

Application to Built in Self Test (BIST)

Figure 3B:
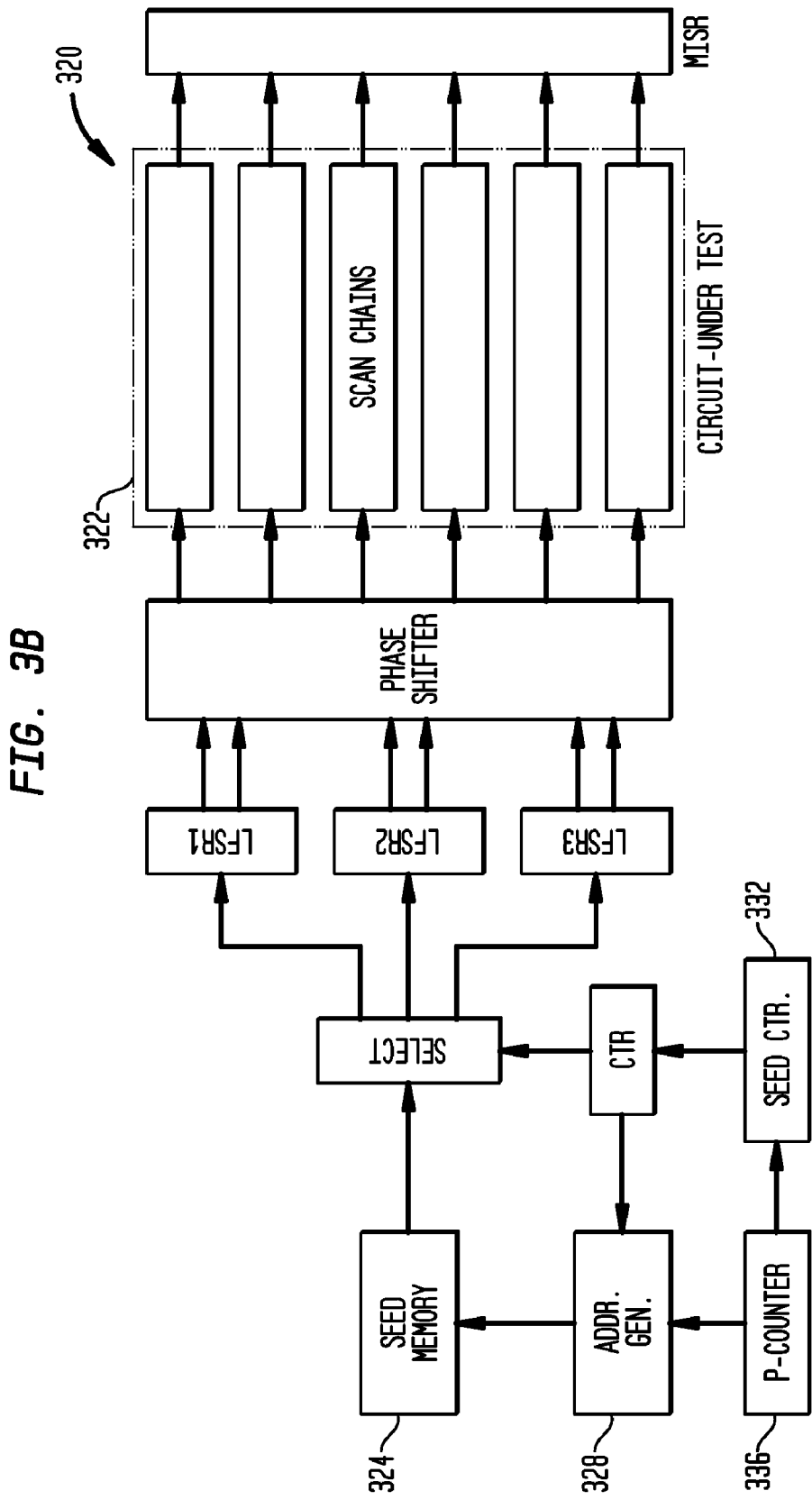
FIG. 3B is a block diagram of a built-in-self-test (BIST) system to test scan chains in accordance with an embodiment of the present invention.

The dictionary based encoding of LFSR seeds discussed in the previous section can be extended to a logic BIST scheme. FIG. 3B is a block diagram of an embodiment of a BIST system 320 to test scan chains 322. The BIST system 320 consists of a seed memory 324 to store the dictionary entries, an address generator 328 to generate the addresses of seeds corresponding to each scan load pattern, and a seed counter 332 that stores the number of LFSRs to be reseeded for each scan load pattern. The system 320 also includes a pattern counter 336. The pattern counter 336 indicates the current scan load pattern and indexes both the seed counter 332 and the address generator 328.

To reduce the size of seed memory (number of entries in the dictionary), seeds for the LFSRs should be chosen in a way that minimizes the total number of unique seeds. The linear equations that are solved to get LFSR seeds usually have multiple solutions and choosing the right one will improve the compression. If the seeds from previous patterns are reused to generate the current patterns, the number of unique seeds is reduced.

A heuristic algorithm for choosing seeds in accordance with an embodiment of the invention is given below. Scan load patterns are reordered according to the number of specified bits in each pattern in descending order, i.e., the pattern with the most specified bits is compressed first. In one embodiment, linear equations for each pattern are formed by symbolically running the LFSRs and comparing it with the specified bits in the pattern. If the dictionary is empty, these equations are solved and the solution is added into the dictionary. Otherwise, for each LFSR reseeded in the current pattern, each entry in the dictionary is tried out as a possible solution.

Since there are multiple LFSRs and several dictionary entries, an algorithm is used to determine the maximum number of LFSRs that can be reseeded using previous dictionary entries. If all the required LFSRs cannot be reseeded using previous dictionary entries, the seeds for the remaining LFSRs are calculated and added into the dictionary. This process continues until all the patterns are processed. Since the patterns that have less specified bits, and hence a number of possible solutions are processed later, the chance of them finding a match in the dictionary is increased.

The algorithm to find the maximum number of LFSRs that can be reseeded using previous dictionary entries is illustrated below with an example. Consider the setup in FIG. 2B where three LFSRs of 4 stages each are used to load six scan chains. Further, assume that the current scan load pattern p, has only five specified bits and can be generated by loading the first two LFSRs.

FIG. 3C shows linear equations for $p_i$ and the current dictionary 340. This set of equations may be solved using Gaussian Elimination and an embodiment of the solution 345 for the equations is written in the form shown in FIG. 3D. In the solution 345, the variables $x_5$, $x_6$, and $x_7$ can take any value and the values of the other variables are determined from these by the relation in FIG. 3D.

FIG. 3E is a diagram of matching dictionary entries. The algorithm starts by determining dictionary entries 350, 355 that can be used as seeds for each LFSR individually. The shaded dictionary entries for each LFSR are such that they satisfy the relation in FIG. 3D for the variables in that LFSR. For example, dictionary entries 2, 3, and 4 can be used as seed for LFSR1 and dictionary entries 2 and 4 can be used as seed for LFSR2. However, to find a complete solution for the pattern $p_i$, the entries selected are such that the relation in FIG. 3D is satisfied for the LFSRs simultaneously. In one embodiment, this is accomplished by maintaining a vector list of possible dictionary entries for all LFSRs simultaneously. In the vector, each coordinate can correspond to one LFSR that needs to be reseeded for the current pattern. The list is initialized with the matching entries of individual LFSRs (with coordinates for other LFSRs as zero (i.e., not selected from the dictionary)). Thus, the vector list is initialized with the matching entries for LFSR1 which are (2,0), (3,0), and (4,0) and matching entries for LFSR2 which are (0,2) and (0,4). New vectors, corresponding to entries from both the LFSRs, are added if they satisfy the relation for the solution. Thus, the vector (3,2), which corresponds to dictionary entry 3 as seed for LFSR1 and dictionary 2 as seed for LFSR2 is added. After this step is completed for the LFSRS, the maximum number of LFSRs that can be reseeded from the dictionary is determined by determining the vector with minimum zeroes in the list. In the above example, this is vector (3,2). Thus, by choosing dictionary entry 3 as seed for LFSR1 and dictionary entry 2 as seed for LFSR2, the pattern $p_i$ can be completely reseeded using entries from the dictionary. In the case when all LFSRs cannot be reseeded using dictionary entries, seeds for the remaining LFSRs are added to the dictionary.

Externally-Loaded Weighted Random Pattern Testing for Test Data Compression

Individual test cubes can be compressed into generators (or weight sets) to achieve higher test data compression. As described above, a test cube is a test pattern that has unspecified bits. A generator for a circuit with n inputs, which is derived from a set of test cubes, is represented by an n-bit tuple $G^k = <G_1^k, G_2^k, \ldots G_n^k>$, where $G_1^k \in \{0,1,X,U\}$. If input $p_i$ is always assigned X or 1 (0) in at least one test cube, then input $p_i$ is assigned 1 (0) in the corresponding generator. If input $p_i$ is always assigned X and not assigned a binary value 1 or 0 in any test cube in the test cube set, input $p_i$ is assigned X in the corresponding generator. Finally, if input $p_i$ is assigned a 1 (0) in test cube $d^a$ and assigned a 0 (1) in test cube $d^b$ in the test cube set, then test cube $d^a$ is said to conflict with test cube $d^b$ at input $p_i$ and input $p_i$ is assigned a U in the generator. Inputs that are assigned U's in the generator $G^k$ are called conflicting bits of generator $G^k$.

FIG. 4A shows an example generator 400 that is computed from a set of 4 test cubes $D^k \in \{d^1, d^2, d^3, d^4\}$ 304. Let $E^k$ be the set of faults of the circuit that are detected by the test cubes in $D^k$ 404. These faults are identified by fault simulating the circuit design with test patterns in $D^k$ 404. Once test patterns are generated, then fault simulation occurs to estimate how much coverage those test patterns can achieve. If high fault coverage is to be achieved by a compressed test pattern, then all faults that are identified to be detected by the test patterns in $D^k$ 404 have to be detected.

In the test cube set $D^k$ 404, input $P_2$ and $p_5$ are assigned only X or 0. Weight 0 is given to $p_2$ and $p_5$ in generator $G^k$ 408. Note that even if inputs $p_2$ and $p_5$ are set to 0's, the faults in $E^k$ can be detected. Because input $p_6$ is assigned X or 1 in every test cube, weight 1 is assigned to input $p_6$. Similar to setting $p_2$ and $p_5$ to 0's, setting input $p_6$ does not make any fault in $E^k$ untestable. Inputs $p_1$ and $p_3$ are assigned 0 in some test cubes and 1 in some other test cubes. Thus, unlike inputs $p_2$, $p_5$, and $p_6$, inputs $p_1$ and $p_3$ cannot be fixed to binary values and weight 0.5 is assigned to these inputs (symbol U that denotes weight 0.5 is given to $P_1$ and $p_3$ in $G^k$ 408). Further, since the value at input $p_4$ is a don't care (i.e., X) in every test cube, X is assigned to $p_4$ in generator $G^k$ 408. The F-pattern $F^k$ 412 is directly derived from $G^k$ 408. If input $p_i$ is assigned a 0 (1) in generator $G^k$ 408, then input $p_i$ is assigned 0 (1) in $F^k$ 412 ($F_i^k$=0(1)). Otherwise, $p_i$ is assigned X in $F^k$ 412.

FIG. 4B is a block diagram of a prior art decompression system 420 for the generator shown in FIG. 4A. The decompression system 420 includes automatic test equipment (ATE) 421, a decompressor 422, and a scan chain 423.

The decompressor 422 includes three test pattern generators (TPGs)—a random TPG (R-TPG) 424, an F-TPG 426, and an S-TPG 428. The R-TPG 424 is typically implemented with a free running random pattern generator, which has no reseeding capability. The F-TPG 426 and the S-TPG 428 are typically implemented with 4-stage LFSRs with reseeding capability. When the output of the S-TPG 428 is set to a 0 at a scan shift cycle, a multiplexor 432 selects the output of the F-TPG 426 as the test pattern source for the scan chain. When the output of the S-TPG 428 is set to a 1 at a scan shift cycle, multiplexor 432 selects the output of the R-TPG 424 as the test pattern source for the scan chain.

The decompressor 420 requires two seeds for each generator, one for the F-TPG 426 and the other for the S-TPG 428. In most LFSR reseeding based compression techniques, the number of stages of the LFSR required to compress a set of test cubes is determined by the number of specified bits in the most specified test cube in the set, which is also referred to below as $S_{max}$. Over-specified bits in test cubes are relaxed, or changed from specified to unspecified bits (i.e., to X's) to reduce $S_{max}$ before generators are computed. However, even after over-specified bits in S-patterns are relaxed to X's, the $S_{max}$ for S-patterns is typically 60% or more of the $S_{max}$ for F-patterns.

The maximum number of conflicting bits or U's allowed in a generator is also referred to below as $U_{max}$. If a large number of U's are allowed (i.e., a large $U_{max}$ is used), then each test cube subset from which a generator is derived can include many test cubes. In order to detect the faults targeted by a set of test cubes that are compressed into a generator, every test cube in the set covers at least one test pattern generated using the generator. An n-bit test cube $t^a$ is said to cover another n-bit test cube $t^b$ if (i) $t_x^n$=V or X, where v=0 or 1, at the positions where $t_x^b$=v, where x=1, 2, ..., n, and (ii) $t_y^a$=X at the positions where $t_y^b$=X, where y=1, 2, ..., n. If a large $U_{max}$ (e.g., 10) is chosen, then, in general, more than $2^{10}$ patterns may be generated by each generator. Hence, it is recommended that the maximum number of conflicting inputs allowed in a generator, i.e., $U_{max}$, be limited to 4 or smaller. Note that if the maximum number of U's allowed in a generator is 3, i.e., $U_{max}$=3, then the R-TPG 424 is selected as the test pattern source only in 3 or fewer shift cycles. Thus, the locations of conflicting scan inputs of a generator with little memory space can be stored. The number of bits required to store the locations of conflicting scan inputs of a generator is given by $U_{max} \times \lceil \log_2 SL \rceil$, where SL is the scan chain length of the design, i.e., the number of scan flip-flops in the scan chain. For example, if the scan chain length of a design is 1000 and $U_{max}$=3, then the total number of bits required to store the locations of the conflicting scan inputs of the generator is $3\lceil \log_2 1000 \rceil$=30 bits.

Figure 5:
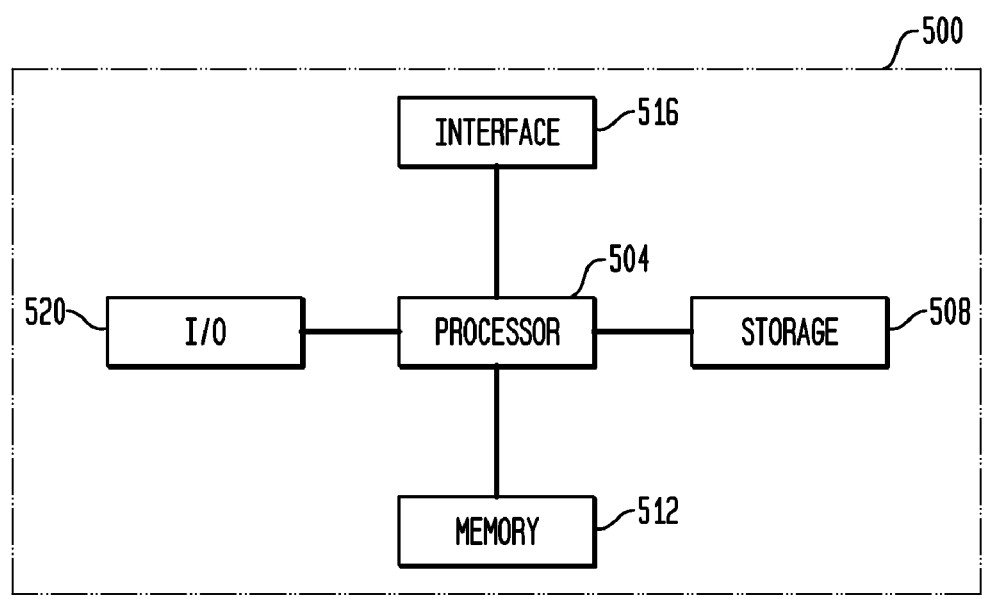
FIG. 5 is a block diagram of a decompression system for the generator shown in FIG. 4A in accordance with an embodiment of the present invention.

The description herein describes the present invention in terms of the processing steps required to implement an embodiment of the invention. These steps may be performed by an appropriately programmed computer, the configuration of which is well known in the art. An appropriate computer may be implemented, for example, using well known computer processors, memory units, storage devices, computer software, and other modules. A high level block diagram of such a computer is shown in FIG. 5. Computer 500 contains a processor 504 which controls the overall operation of computer 500 by executing computer program instructions which define such operation. The computer program instructions may be stored in a storage device 508 (e.g., magnetic disk) and loaded into memory 512 when execution of the computer program instructions is desired. Computer 500 also includes one or more interfaces 516 for communicating with other devices (e.g., locally or via a network). Computer 500 also includes input/output 520 which represents devices which allow for user interaction with the computer 500 (e.g., display, keyboard, mouse, speakers, buttons, etc.). The computer 500 may be used to perform the uncompaction described above and to compute generators from test patterns.

One skilled in the art will recognize that an implementation of an actual computer will contain other elements as well, and that FIG. 5 is a high level representation of some of the elements of such a computer for illustrative purposes. In addition, one skilled in the art will recognize that the processing steps described herein may also be implemented using dedicated hardware, the circuitry of which is configured specifically for implementing such processing steps. Alternatively, the processing steps may be implemented using various combinations of hardware and software. Also, the processing steps may take place in a computer or may be part of a larger machine.

Decompression System

Figure 6:
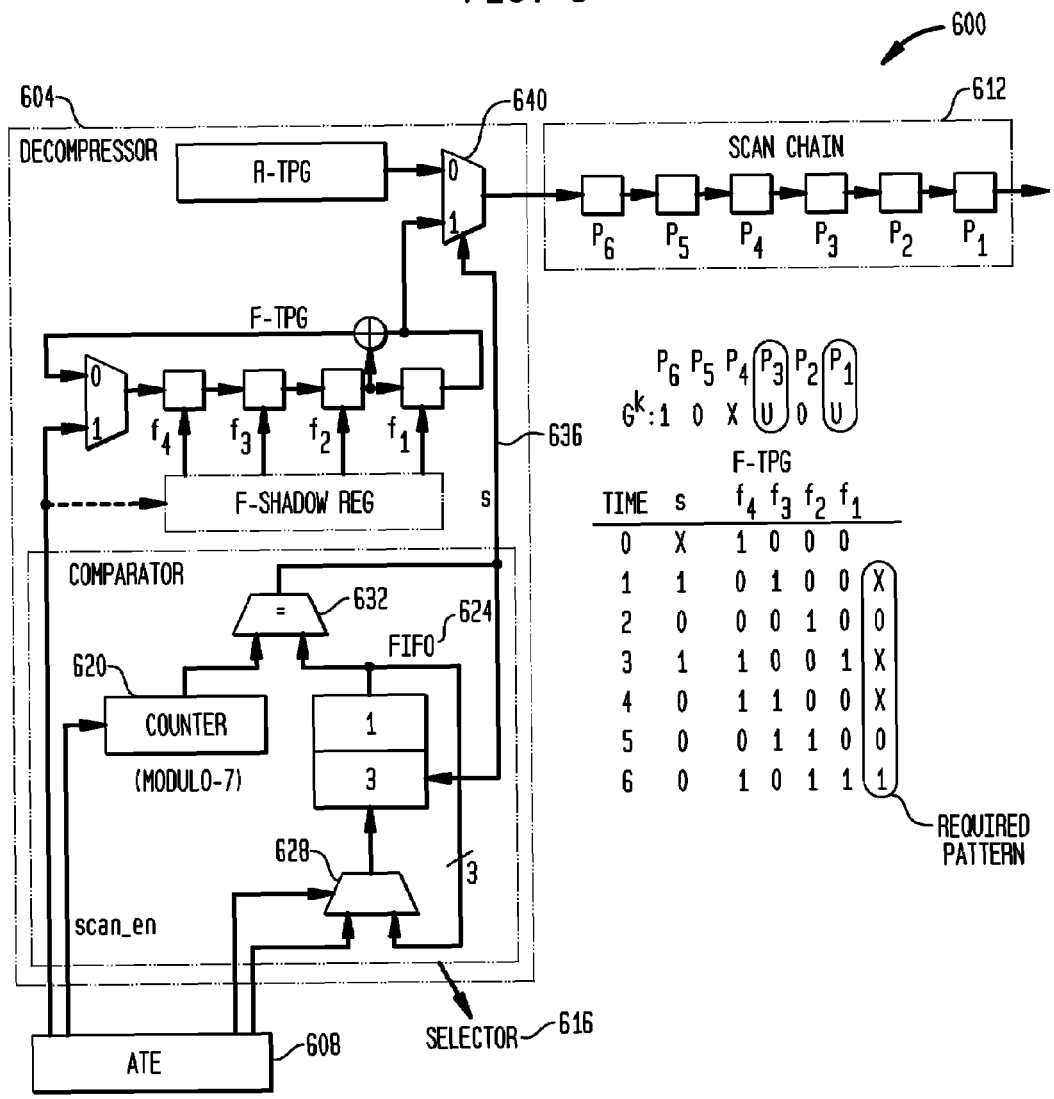
FIG. 6 is a diagram illustrating generators computed from a set of test cubes D in accordance with an embodiment of the present invention.

FIG. 6 is a block diagram of a decompression system 600 in accordance with an embodiment of the invention. The decompression system 600 includes a decompressor 604 in communication with an ATE 608 and a scan chain 612. The S-TPG of the decompressor 420 of FIG. 4B has been replaced by selector 616. The selector 616 includes a modulo-7 counter 620, a 2×3 FIFO buffer 624, a multiplexer 628, and a comparator 632. The modulo-7 counter 620 is reset to 0 in every capture cycle and then increments by 1 thereafter at every shift cycle. The output s 636 of the comparator is set to 1 when the content of the modulo-7 counter 620 is equal to the first entry of the FIFO and set to 0 in all other cycles. (Since the FIFO 624 is loaded with the locations of conflicting scan inputs of $G^k$, i.e., 1 and 3, the output of the comparator is set to a 1 in the cycles when the content of the counter is 1 and 3 and a 0 in all other cycles.) The F-TPG is loaded with a seed for $F^k$. When the output s 636 of the comparator 632 is set to a 1, a multiplexor 540 selects the output of the R-TPG as the test pattern source for the scan chain 612. If, however, the output s 636 of the comparator 632 is set to a 0, multiplexor 640 selects the output of the F-TPG as the test pattern source for the scan chain 612. When the output s 636 of the comparator 632 is set to 1, the entries in the FIFO 624 are rotated by one entry. Thus, once a test pattern is generated and fully loaded into the scan chain 612, the contents of the FIFO 624 are automatically reset to the initial state.

The decompression system 600 enables a reduction in the total number of test data storage bits required per generator. Thus, the decompression system 600 enables a reduction in the overall test data volume relative to prior art systems (e.g., system 420). Since storing locations of conflicting scan inputs of a generator requires very little memory storage, the selector FIFO 624 of decompressor 600 may be implemented with a small number of storage cells even for large designs.

In accordance with an embodiment of the invention, a static approach is used to compress test cubes into generators. The static approach uses fully specified test patterns generated by the decompressor rather than, e.g., partially specified test cubes, to drop faults from target fault lists. Further, the static approach relaxes over-specified bits in test cubes dynamically rather than statically—over-specified bits in each test cube are relaxed just before it is added into the test cube set that is being formed rather than in a preprocessing step.

In one embodiment, designate the set of test cubes to be compressed as D. Test cubes in D are grouped into smaller test cube subsets, $D^1$, $D^2$, ..., and a generator $G^k$, where k=1, 2, ..., is computed from each test cube subset $D^k$. Each test cube subset $D^k$ is constructed by moving test cubes from D into $D^k$ until adding any more test cube in D into $D^k$ makes the number of care bits (0, 1, U) in the corresponding generator $G^k$ greater than a predefined number $S_{max}$ or the number of conflicting bits in $G^k$ greater than another predefined number $U_{max}$.

Figures 7A, 7B:
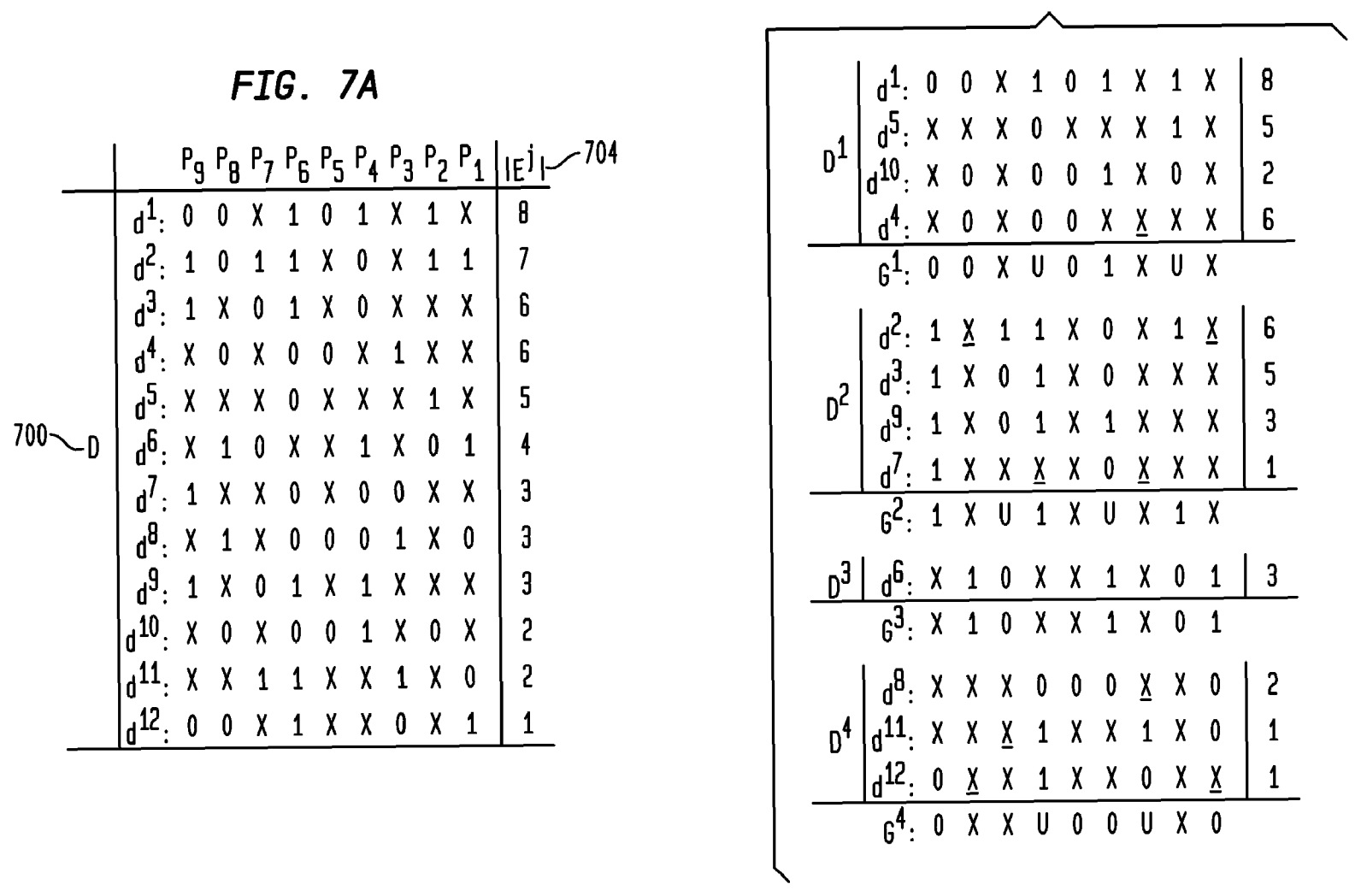

FIG. 7 shows computing generators from a set of test cubes D 700 in accordance with an embodiment of the present invention. The set of test cubes D 700 has 12 test cubes. Assume that $S_{max}$ is set to 6 and $U_{max}$ is set to 2. Fault simulation is executed with the entire test cube $d^j$, where j=1, 2, ..., 12. Then, test cube subsets are constructed from $D^1$ by moving test cubes from D one test cube at a time. The column $|E_j|$ 704 shows numbers of faults in target fault lists. First, an empty set $D^1$ is created and generator $G^1$ is initialized to <X, X, X, ..., X>. The test cube that has the most faults in its target fault list is selected as the first test cube to be moved. Since $d^1$ has the most faults in its target fault list, $d^1$ is selected first to be moved into $D^1$. After $d^1$ is added into $D^1$, $G^1$=<$G_9^1$, $G_8^1$, ..., $G_1^1$> is updated to <0, 0, X, 1, 0, 1, X, X>. Next, the test cube that causes the minimum number of conflicting bits in $G^k$ is selected from D. Since $d^5$ causes 1 conflicting bit and 6 specified bits in $G^k$ (smaller than $S_{max}$), $d^5$ is selected as the next test cube. In one embodiment, over-specified bits in $d^5$ are relaxed.

Assume that no over-specified bits are relaxed to X's in $d^5$. After $d^5$ is added into $D^1$, $G^k$ is updated to <0, 0, X, U, 0, 1, X, 1, X>. Adding $d^{10}$ and $d^4$ into $D^1$ both causes 1 additional conflicting bit in $G^k$ greater than $S_{max}$. Assume that $d^{10}$ is selected as the next test cube. Since no over-specified bits are identified in $d^{10}$, it is added into $D^1$ as it is. $G^k$ is updated to <0, 0, X, U, 0, 1, X, U, X>.

Since the numbers of specified and conflicting bits to be incurred by adding a test cube are computed before over-specified bits in the test cube are relaxed, some test cubes that make the number of specified bits in $G^k$ greater than $S_{max}$ or the number of conflicting bits greater than $U_{max}$ before the relaxation can be added without exceeding $S_{max}$ or $U_{max}$ after over-specified bits in test cubes are relaxed to X's. Margins $M_u$ and $M_s$ are introduced to compensate for this inaccuracy. If no test cube in D can be added into $D^1$ without exceeding $S_{max}$ or $U_{max}$ before the relaxation, then a test cube in D is selected that does not make the number of specified bits in $G^k$ greater than $S_{max}+M_s$ or the number of conflicting bits greater than $U_{max}+M_u$ and relax over-specified bits in that test cube. Assume that margins $M_u$ and $M_s$ are both set to 1. If the selected test cube still makes the number of conflicting bits greater than $U_{max}$ even after over-specified bits are relaxed to X's, then the selected test cube is returned to D.

In one embodiment, no test cube in D can be added without exceeding $S_{max}$ or $U_{max}$. However, adding $d^4$ (before relaxing over-specified bits) makes the number of specified bits 7 (not greater than $S_{max}+M_s$) and the number of conflicting inputs 2. In one embodiment, $d^4$ is selected as the next candidate. Since the 1 assigned at $p_3$ is relaxed to X, $d^4$ is added to $D^1$. Adding $d^4$ does not change generator $G^k$. Next, adding $d^9$ to $D^1$ makes the number of conflicting bits in $G^k$ 3 ($U_{max}+M_u=3$) and makes the number of care bits 7 ($S_{max}+M_s=7$). Thus, $d^9$ is selected as the next candidate. However, since none of the bits can be relaxed from $d^9$, it cannot be added into $D^1$ and thus returned to D. Thus, no more test cubes from D can be added into $D^1$ without making the number of specified bits in $G^k$ greater than $S_{max}+M_s$ or the number of conflicting bits greater than $U_{max}+M_u$. In one embodiment, the construction of $D^k$ is completed.

Then, an F-pattern $F^1$=<0, 0, X, X, 0, 1, X, X, X> is obtained from generator $G^1$=<0, 0, X, U, 0, 1, X, U, X>. In one embodiment, a seed for $F^1$ is computed with a linear solver. The F-TPG is loaded with the computed seed and the selector FIFO is loaded with locations of conflicting scan inputs of $G^1$, i.e., 2 and 6. $2^{Umax}$ test patterns are generated by using the proposed decompressor. If there is any deterministic test cube in $D^1 \in \{d^1, d^5, d^{10}, d^4\}$ that covers no test pattern in the set of $2^2$ test patterns generated by the decompressor, then more test patterns are generated by the decompressor until all the 4 test cubes cover at least one test pattern generated by the decompressor.

Fault simulation is then executed with the generated test patterns, which are fully specified. Further, detected faults are dropped from the target fault lists of test cubes remaining in D. Note that $|E_j|$ of some test patterns $d^j$ have been reduced. In one embodiment, this process is repeated until all test cubes are removed from D. In this example, the 12 test cubes in D are compressed into 4 generators.

Uncompacting Compacted Test Cubes

Prior art test pattern compaction techniques merge several test cubes, each of which are generated for a different target fault, into one test cube (static compaction) or specify don't cares that exist in test cubes to target secondary faults during ATPG process (dynamic compaction) to reduce the test pattern count. Highly compacted test cubes have large numbers of specified bits. Test cubes that are fault simulated first often have very large number of faults in their target fault lists. Hence, even if some faults in their target faults lists are dropped by test patterns generated by using already computed generators, large number of faults may still remain in their target fault lists and only a few specified inputs can be relaxed to X's in those test cubes. The test data size is roughly given by:

$$\# \text{ of generators} \times (S_{max}+U_{max} \times \lceil \log_2 SL \rceil) \quad (1),$$

where $S_{max}$ is the number of specified bits in the most specified F-pattern and SL is the scan chain length of the design. Since typically $S_{max}$ is larger than $U_{max} \times \lceil \log_2 SL \rceil$, large $S_{max}$ directly increases overall test data storage. Since the number of test cubes that can be added into test cube subsets is limited by Umax in most test cube subsets, increasing $S_{max}$ does not typically reduce the number of generators.

Figure 8:
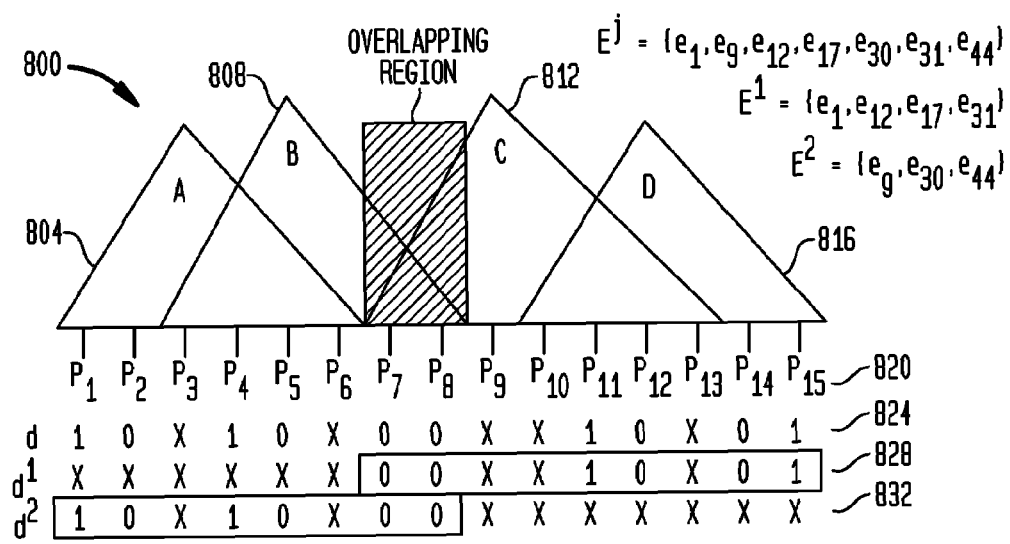
FIG. 8 shows a high level block diagram of a computer system which may be used in an embodiment of the invention.

In accordance with an embodiment of the present invention, a test pattern uncompaction technique can be used to reduce numbers of specified bits in (e.g., highly) compacted test cube sets. The uncompaction technique divides specified bits in a test cube that has a large number of specified bits into two test cubes. Each of the two test cubes has significantly fewer specified inputs than the original test cube. FIG. 8 illustrates a circuit 800 for dividing specified bits in a test cube into two test cubes via the test pattern uncompaction technique. The circuit 800 includes four circuit cones, A 804, B 808, C 812, and D 816 and 15 scan inputs 820, $p_1, p_2, \ldots, p_{15}$.

For example, assume that test cube $d^j$ 824 has too many specified bits (10 bits). Also assume that the number of specified bits in every test cube is to be limited to 6 (i.e., $S_{max}$=6). Since test cube $d^j$ 824 has more care bits than $S_{max}$, specified bits in $d^j$ 824 are now divided into two test cubes $d^{j1}$ 828 and $d_{j2}$ 832 by the uncompaction technique.

To minimize the overall number of specified bits in test cubes, the following is performed. The partitioned test cubes $d^{j1}$ 828 and $d^{j2}$ 832 are balanced, i.e., the number of specified bits in $d^{j1}$ 828 should be close to that of specified bits in $d^{j2}$ 832. The overlaps of specified bits between $d^{j1}$ 828 and $d^{j2}$ 832 are then minimized. In other words, if input $p_i$ 820 is specified in $d^{j1}$ 828, then input $p_i$ 820 is not specified in $d^{j2}$ 832, and vice versa. Note that bi-partitioned test cubes $d^{j1}$ 828 and $d^{j2}$ 832 can detect faults in the target fault list $E^j$ of the original test cube $d^j$ 824.

Figure 9:
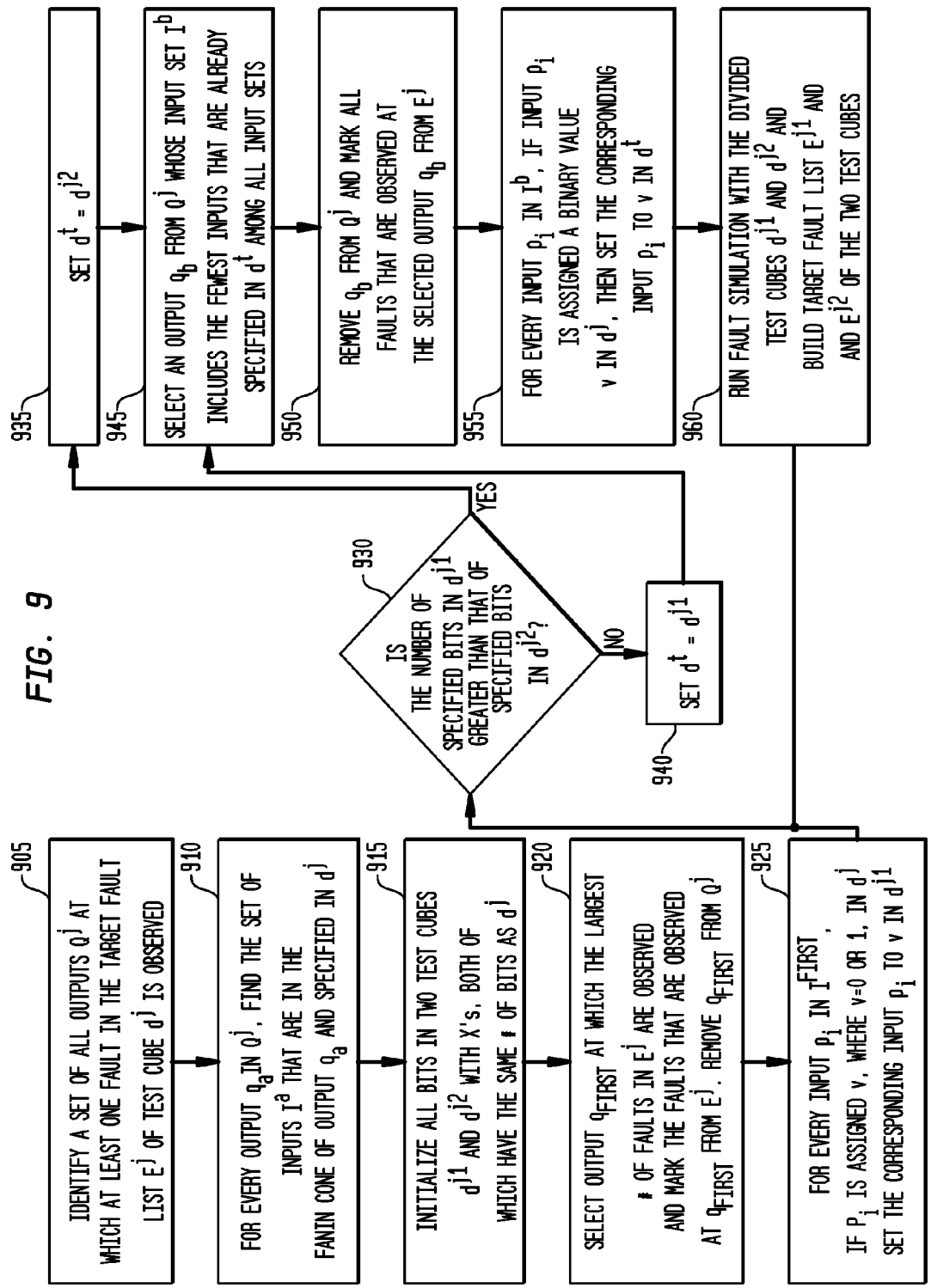
FIG. 9 is a flowchart showing the steps performed by the processor to divide a test cube $d^j$ into two fewer specified test cubes $d^{j1}$ and $d^{j2}$ such that $d^{j1}$ and $d^{j2}$ are balanced and have a minimal number of overlapping specified bits.

FIG. 9 is a flowchart showing the steps performed by the computer to divide test cube $d^j$ into two fewer specified test cubes $d^{j1}$ and $d^{j2}$ such that $d^{j1}$ and $d^{j2}$ are balanced and have minimal number of overlapping specified bits. The computer identifies a set of all outputs $Q^j$ at which at least one fault in the target fault list $E^j$ of test cube $d^j$ is observed in step 905. For every output $q_a$ in $Q^j$, the computer locates the set of inputs $I^a$ that are in the fanin cone of output $q^a$ and specified in $d^j$ in step 910. The computer then initializes all bits in two test cubes $d^{j1}$ and $d^{j2}$ with X's, both of which have the same number of bits as $d^j$ in step 915. An output $q_{first}$ is then selected at which the largest number of faults in $E^j$ are observed. The faults that are observed are marked, and $q_{first}$ is then removed from $Q^j$ in step 920.

For every input $p_i$ in $I^{first}$, if $p_i$ is assigned v, where v=0 or 1, in $d_j$, the computer sets the corresponding input $p_i$ to v in $d^{j1}$ in step 925. It is then determined whether the number of specified bits in $d^{j1}$ greater than that of specified bits in $d^{j2}$ in step 930. If so, then $d^t=d^{j2}$ in step 935. If not, then $d^t=d^{j1}$ is set in step 940. Next, an output $q_b$ from $Q^j$ whose input set $I^b$ includes the fewest inputs that are already specified in $d^t$ among all input sets selected in step 945. $q_b$ is then removed from $Q^j$ and all faults that are observed at the selected output $q_b$ from $E^j$ are marked in step 950.

For every input $p_i$ in $I^b$, if input $p_i$ is assigned a binary value v in $d^j$, then the corresponding input $p_i$ is set to v in $d^r$ in step 955. The computer then executes fault simulation with the divided test cubes $d^{j1}$ and $d^{j2}$ and builds a target fault list $E^{j1}$ and $E^{j2}$ of the two test cubes in step 960. The process then returns to step 930 and continues.

If the number of specified bits in either of the partitioned test cubes is still greater than $S_{max}$, then the specified bits in the test cube is further divided into another pair of test cubes. This is repeated until the number of specified bits in every test cube in the set is smaller than or equal to $S_{max}$.

Figure 1A:
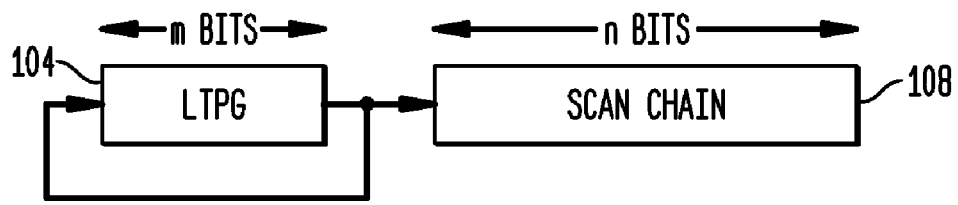
FIG. 1 is a block diagram of a prior art decompressor.
Figure 1B:
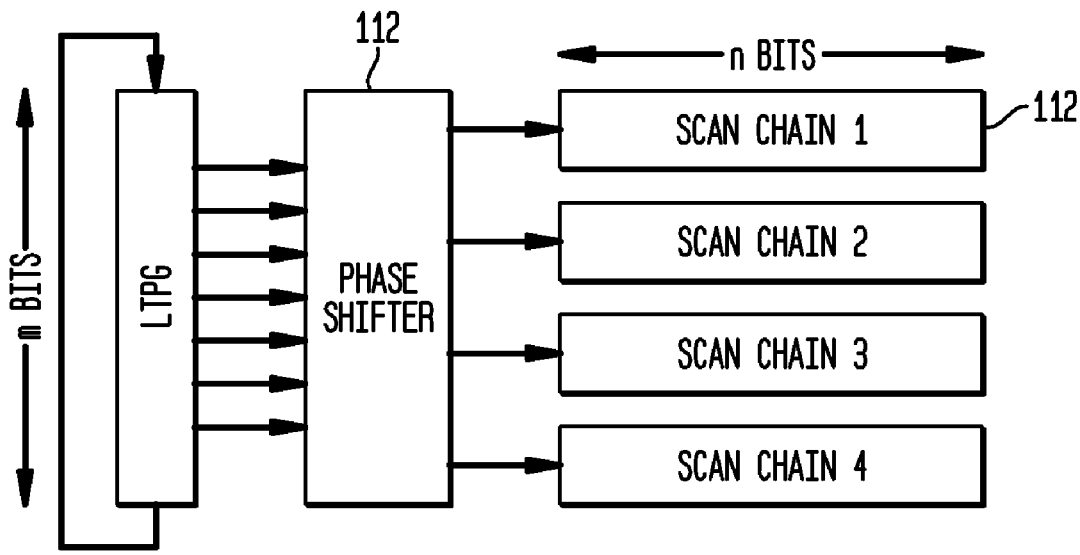
Figure 10A:
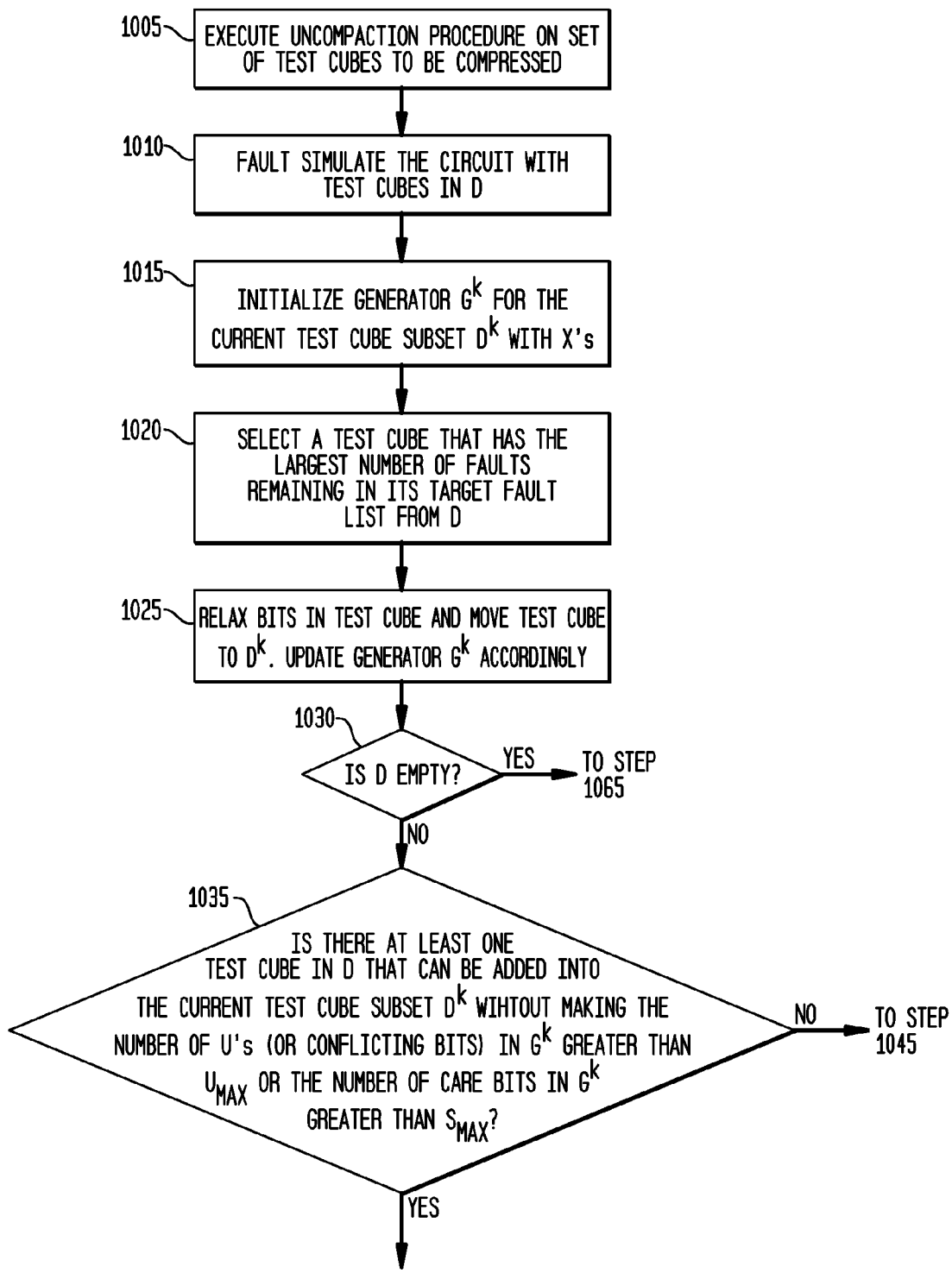
FIGS. 10A and 10B are flowcharts showing the steps performed to compute generators from a test cube set in accordance with an embodiment of the invention.
Figure 10B:
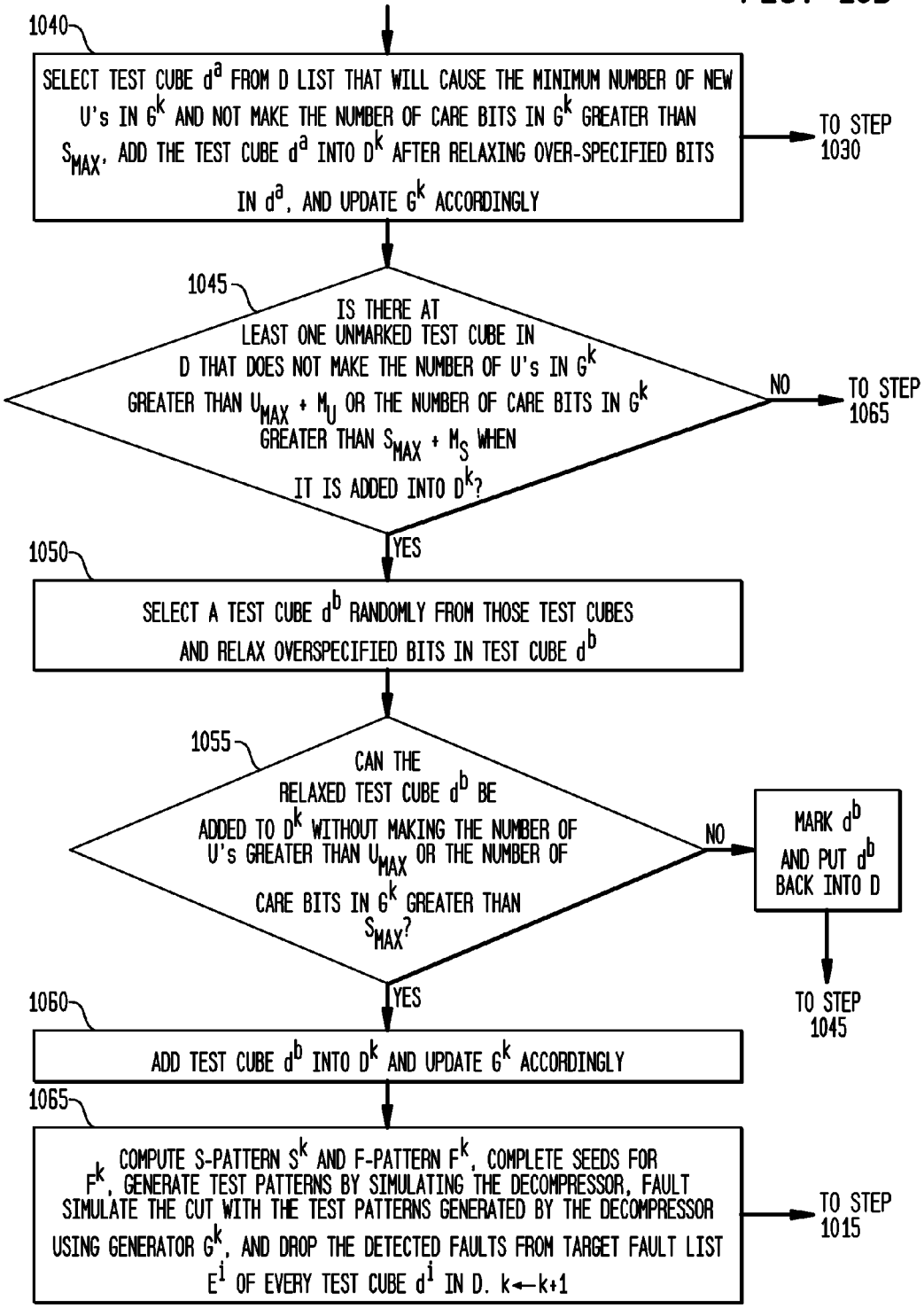

FIGS. 10A and 1 08 are flowcharts showing the steps performed by the computer to compute generators from a test cube set in accordance with an embodiment of the invention. The computer performs the uncompaction procedure on the set of test cubes that are to be compressed in step 1005. The circuit under test (CUT) is then fault simulated with test cubes in D and a target fault list for every test cube is built in step 1010. $S_{max}$ is then defined as the number of specified bits in the most specified test cube. k←1. The computer then unmarks all test cubes in D and initializes generator $G^k$ for the current test cube subset $D^k$ with X's, i.e., $G^k \leftarrow <X, X, \ldots, X>$ and $D^k \leftarrow \{\ \}$ in step 1015. The computer selects a test cube that has the largest number of faults remaining in its target fault list from D in step 1020, relaxes over-specified bits in the test cube, and moves it to $D^k$ in step 1025. The computer also updates generator $G^k$ accordingly (since the added test cube is the only test cube in $G^k$, $G^k$ can be updated by copying the added test cube to $G^k$) in step 1025.

Next, the computer determines if D is empty in step 1030. If so, then the computer moves to step 1065 and computes S-pattern $S^k$ and F-pattern $F^k$. In one embodiment, the computer expands $G^k$, computes seeds for $F^k$ by using a linear solver, and generates test patterns by simulating the decompressor in step 1065. The computer can simulate the decompressor by, for example, loading the F-TPG with the calculated seed and loading the selector FIFO with locations of conflicting scan inputs. The computer also fault simulates the circuit under test with the test patterns generated by the decompressor using generator $G^k$, and drops the detected faults from the target fault list $E^i$ of every test cube $d^i$ in D in step 1065. k←k+1. The computer then returns to step 1015.

If, however, the computer determines (in step 1030) that D is not empty, the computer then determines in step 1035 whether there is at least one test cube in D that can be added into the current test cube subset $D^k$ without making the number of U's (or conflicting bits) in $G^k$ greater than $U_{max}$ or the number of care bits in $G^k$ greater than $S_{max}$. If so, then the computer selects test cube $d^a$ from D that causes the minimum number of new U's in $G^k$ and not make the number of care bits in $G^k$ greater than $S_{max}$. The computer also adds the test cube $d^a$ into $D^k$ after relaxing over-specified bits in $d^a$, and updates $G^k$ accordingly in step 1040. The computer then repeats step 1030 until the computer determines that D is empty.

If the computer determines that the result of step 1035 is negative, the computer executes step 1045 and determines if there is at least one unmarked test cube in D that does not make the number of U's in $G^k$ greater than $U_{max}+M_u$ or the number of care bits in Gk greater than $S_{max}+M_s$ when it is added into $D^k$. If so, a test cube $d^b$ is randomly selected from those test cubes and overspecified bits in test cube $d^b$ are relaxed in step 1050. Otherwise, step 1065 is performed. The computer then determines, in step 1055, if the relaxed test cube $d^b$ is to be added to $D^k$ without making the number of U's greater than $U_{max}$ or the number of care bits in $G^k$ greater than $S_{max}$. If so, test cube $d^b$ is added into $D^k$ and $G^k$ is updated accordingly in step 1060. Otherwise, $d^b$ is put back into D. The computer then executes step 1045, as described above.

Variations of the Selector

As described above, the test patterns generated by using each generator are fault stimulated to drop faults from target fault lists of test cubes in D. In order to relax more specified bits to X's in test cubes, more faults should be dropped from target fault lists of test cubes in D by test patterns generated by using each generator. Consider the decompressor and generator shown in FIG. 5. Since only two inputs are assigned U's in $G^k$, all test patterns generated by the decompressor differ only at 2 inputs, $p_1$ and $p_3$. Since the test patterns generated are similar, a few new faults can be detected by each test pattern and only a small number of specified bits can be relaxed to X's from each test cube in D. This may increase the number of generators.

Figure 11B:
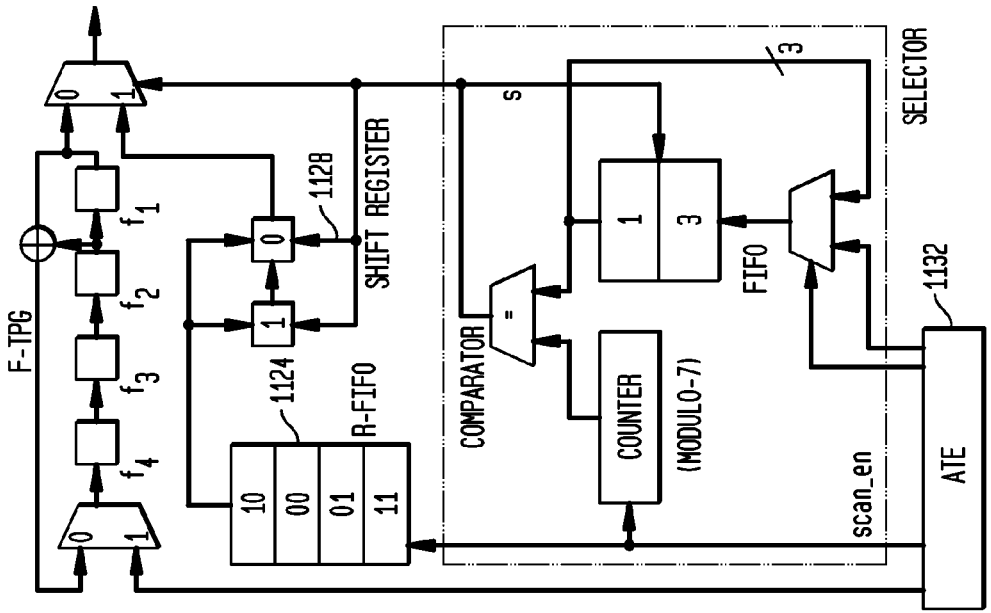
FIG. 11B is a block diagram of another example of a decompressor in accordance with another embodiment of the present invention.
Figure 11A:
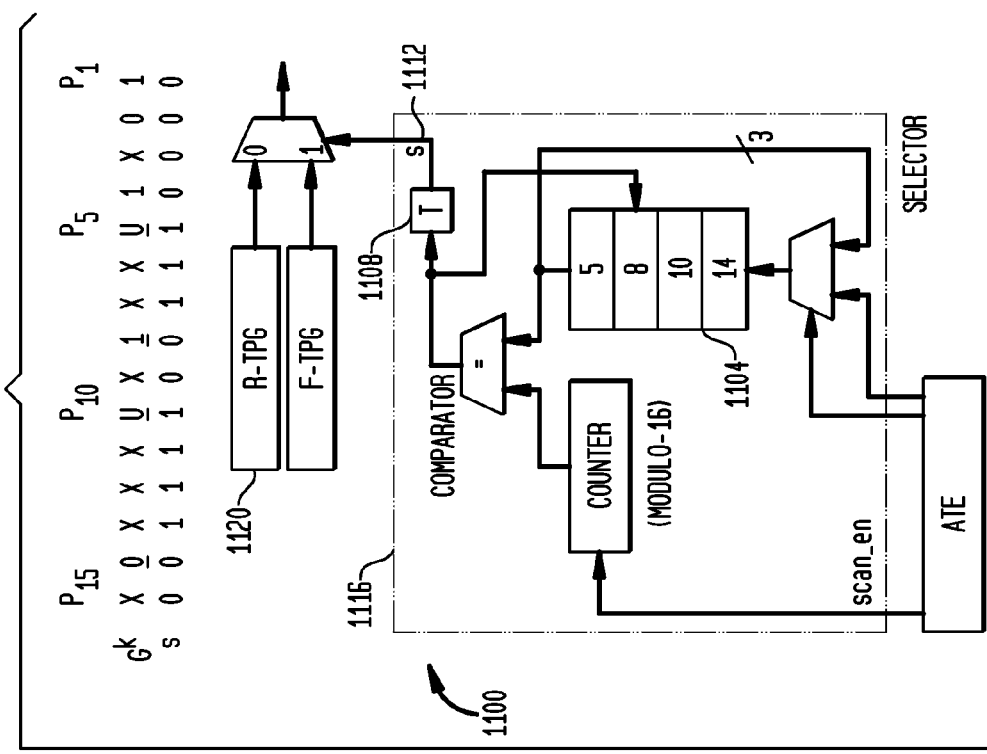
FIG. 11A shows an additional example of a decompressor in accordance with an embodiment of the present invention.

FIG. 11A shows an additional example of a decompressor 1100 in accordance with an embodiment of the present invention. Selector FIFO 1104 is loaded for $G^k=<X, 0, X, X, X, U, X, 1, X, X, U, 1, X, 0, 1>$. Even if generator $G^k$ has only two U's, the selector FIFO 1104 has 4 entries and a toggle flip-flop 1108 is inserted between the select signal 1112 of the multiplexer and the output of comparator 1116. Because of the toggle flip-flop 1108, the consecutive scan inputs $p_5$, $p_6$, and $p_7$ and the consecutive inputs $p_{10}$, $p_{11}$, $p_{12}$ and $p_{13}$ are assigned test patterns generated by the R-TPG (the toggle flip-flop 1108 is reset to 0 in each capture cycle). Hence the decompressor 1100 can generate test patterns with more variations between test patterns. Since test patterns with more variations detect more new faults, this can reduce the number of generators.

In FIG. 4A, inputs $p_3$ and $p_1$, which are assigned U's, are assigned respectively 10 in test cube $d^1$, 0X in test cube $d^2$, 01 in test cube $d^3$, and 11 in test cube $d^4$. In order to detect faults that are detected by $d^1$, $d^2$, $d^3$, and $d^4$, the decompressor can continue generating test patterns using the same generator $G^k$ until the decompressor generates 4 test patterns, each of which respectively assigns 10, 00 or 01, 01, and 11 to $p^3$ and $p^1$. Since R-TPG 1120 is free running, i.e., it is not loaded with seeds to change sequences of patterns, the R-TPG 1120 may not generate a test pattern that assigns desired values to the conflicting inputs of the generator for a long period time. Often, a lot more than $2^{U^{max}}$ patterns need to be generated by using a single generator. Even though this does not typically increase test data volume, it can increase test application time, which may also affect test cost.

Another variant of the decompressor is shown in FIG. 11B. The decompressor of FIG. 11B can reduce the number of test patterns that may be generated by using each generator. Note that the R-TPG is replaced by a FIFO (called R-FIFO) 1124 and a shift register 1128. The R-FIFO is configured to store deterministic values of conflicting inputs. If $U_{max}=3$, i.e., the maximum number of conflicting inputs allowed in a generator is 3, and the R-TPG is realized with an LFSR, then typically $2^3=8$ or more test patterns can be generated by each generator to provide desired values to conflicting scan inputs of the generator by random patterns.

Consider generating test patterns by generator $G^k$ shown in FIG. 4A. Note that the R-FIFO 1124 is loaded with 10, 00, 01 and 11, which are covered by respectively 10, 0X, 01, and 11 that inputs $p_3$ and $P_1$ are assigned in the 4 test cubes $d^1$, $d^2$, $d^3$, and $d^4$. In each capture cycle, the value in the first entry of the R-FIFO 1124 is loaded into the shift register 1128 and the other entries in the R-FIFO 1124 are shifted up by one entry. Note that in this variant of the decompressor, if $N_p$ test cubes are compressed into a generator $G^k$, then only $N_p$ test patterns need to be generated by the decompressor using $G^k$. Since extra test data for the R-FIFO 1124 is stored in ATE 1132, this variant of the decompressor requires larger test data to be stored in the ATE memory than the basic volume shown in FIG. 5. However, since test data storage for the R-FIFO 1124 is significantly smaller than that for F-patterns, increase in test data volume due to storing the extra test data is not significant. This variant of the decompressor can be used to reduce test application time.

Extension to Multiple Scan Chain

Figure 12:
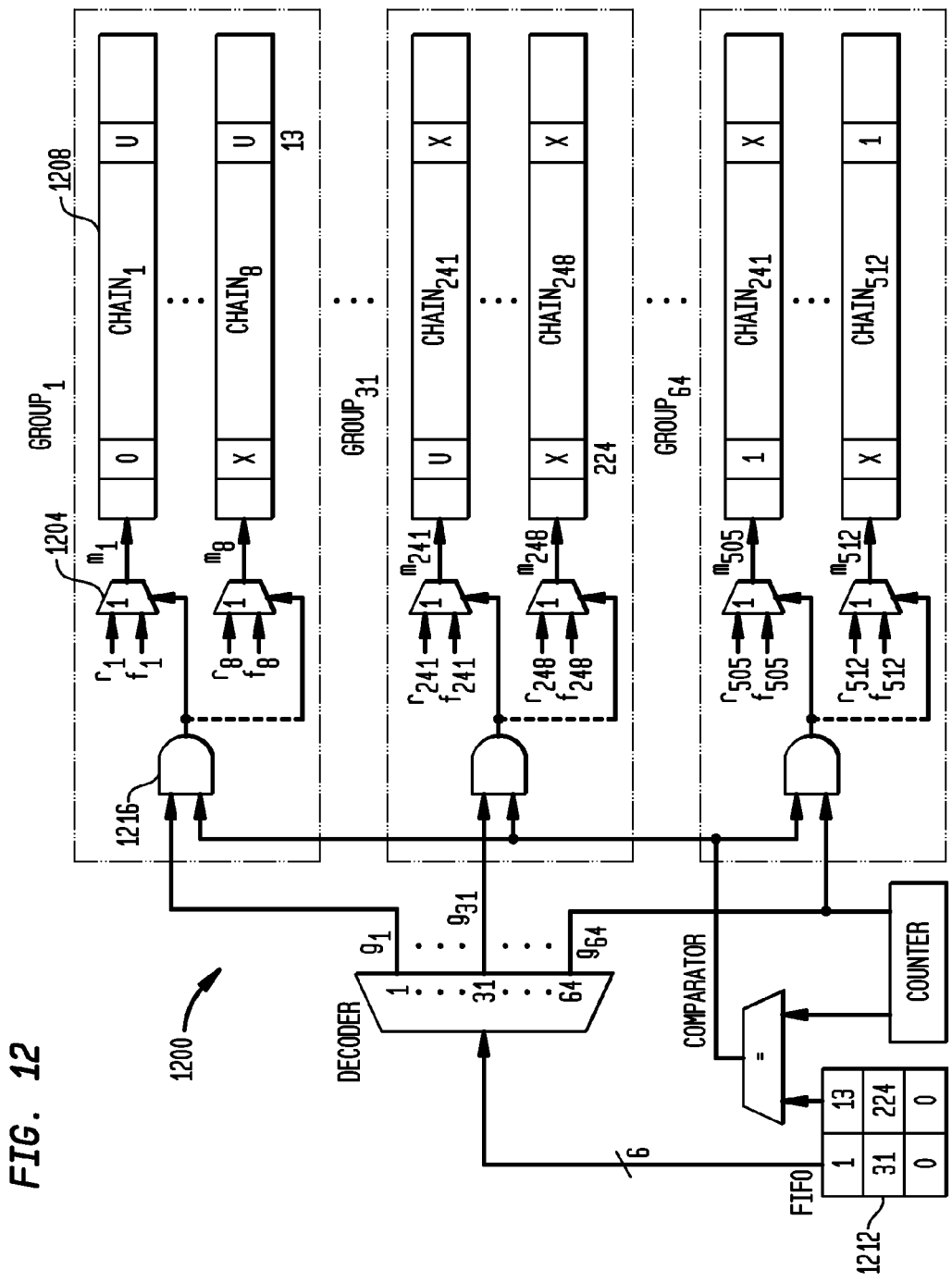
FIG. 12 is a block diagram of another example of a decompressor implemented for a circuit with 512 scan chains.

FIG. 12 depicts another embodiment of a decompressor 1200 implemented for a circuit with 512 scan chains. Assume that the 512 scan chains are comprised of 256 scan flip-flops. A multiplexer $m_h$ (e.g., multiplexer $m_1$ 1204) is inserted before the input of each scan chain chain$_h$, (e.g., scan chain chain$_1$ 1208) where h=1, 1, 2, . . . , 512, to select a scan pattern source between output $f_h$ of the F-TPG and output $\Gamma_h$ of the R-TPG. In one embodiment, each entry of selector FIFO 1212 is divided into two sections: one for group identification number and the other for location of the scan flip-flop in the scan chain. For example, the first entry in the FIFO 1212 has 1 for the group identification and 13 for the location of the scan flip-flop. In one embodiment, the 512 scan chains are organized into 64 groups, each of which has 8 scan chains. The select input of all 8 multiplexers in the same group group$_g$ is driven by the output of a common 2-input AND gate (e.g., AND gate 1216). Hence, if the output of the AND gate for group$_g$ is set to a 1 (0) at i-th shift cycle, then the i-th flip-flops of the 8 scan chains in group$_g$ are loaded with values generated by the R-TPG (F-TPG).

For example, consider computing a generator for decompressor 1200. FIG. 13 shows a test cube subset and corresponding generator $G^k$ 1302 under construction for the scan chains in group$_1$. Assume the test cube $d^b$ 1304 has been added into the current test cube subset following test cube $d^a$ 1308. Generator $G^k$ 1302 is now updated accordingly. Since scan input $p_{1,224}$ (the 224$^{th}$ scan input in the scan chain chain$_1$) is assigned conflicting values in $d^a$ and $d^b$ ($p_{1,224}$ is assigned a 0 in $d^a$ and a 1 in $d^b$), $p_{1,224}$ is assigned U in the generator 1302 and scan values for $p_{1,224}$ come from the R-TPG. On the other hand, $p_{2,224}$, i.e., the 224-th flip-flop of chain$_2$, which belongs to the same group as $p_{1,224}$ is assigned a 1 in $d^a$ 1308 and assigned an X in $d^b$ 1304. The values 1 and X that are assigned to $P_{2,224}$ respectively in $d^a$ 1308 and $d^b$ 1304 do not conflict with each other. However $P_{2,224}$ is updated to a U instead of 1 in the generator 1302, since $P_{1,224}$ is assigned a U in the generator 1302 (scan values for $P_{1,224}$ enter the scan chain in the same shift cycles as $P_{2,224}$ and $P_{1,224}$ and $P_{2,224}$ belongs to the same group). Note that the don't care X assigned to $P_{8,224}$ in the generator 1302 need not be replaced by U because input $P_{8,224}$ is a don't care in both $d^a$ 1308 and $d^b$ 1304.

In one embodiment, if the number of scan chains in each group is too large, then the number of test cubes that can be added into each test cube typically decreases since the number of conflicting bits will reach $U_{max}$ quickly. This, in turn, increases the total number of generators and decreases the compression ratio.

If, however, the number of scan chains in each group is too small, then it typically increases hardware overhead and also test data volume. If the number of chains in each group is reduced from 8 to 4 for the decompressor 1200, then the total number of groups can increase from 64 to 128. The 64×64 decoder should be replaced by a 7×128 decoder, which is larger than the 6×64 decoder. Further, 64 additional 2-input AND gates and extra routing can be added to connect the 64 additional AND gates to the outputs of the decoder. In one embodiment, the group identification section of the selector FIFO also uses one additional bit. The optimal number of scan chains in a group, i.e., sizes of groups, is determined by considering the number of specified bits in test cubes. In one embodiment, if test cubes are sparsely specified, then large sizes of groups is preferred.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. A logic testing system comprising:
    a plurality of test pattern generators, each test pattern generator in said plurality having a plurality of stages and configured to generate test patterns for one or more scan chains; and
    a phase shifter comprising a plurality of exclusive OR (XOR) gates and in communication with said one or more scan chains and said plurality of test pattern generators such that at least one stage of each test pattern generator in said plurality of test pattern generators is connected to each XOR gate of said phase shifter,
    wherein at least a portion of stages of at least a portion of test pattern generators in said plurality of test pattern generators is seeded.

2. The logic testing system of claim 1 wherein said at least a portion of test pattern generators that are seeded depends on a number of specified bits in a test pattern.

3. The logic testing system of claim 1 wherein each test pattern generator in said plurality of test pattern generators is connected to a different clock domain.

4. The logic testing system of claim 1 wherein at least one of said plurality of test pattern generators further comprises at least one of a linear feedback shift register and a linear hybrid cellular automata.

5. The logic testing system of claim 1 wherein the number of stages in said plurality depends on a maximum number of specified bits ($S_{max}$) in a test pattern with unspecified bits and a margin.

6. The logic testing system of claim 1 wherein a test pattern generator in said plurality is configured to generate seeds for a group of test cubes.

7. The logic testing system of claim 1 further comprising a dictionary configured to store a plurality of seeds.

8. The logic testing system of claim 7 further comprising an index associated with said plurality of seeds.

9. The logic testing system of claim 7 wherein said dictionary is configured to store a plurality of seeds in memory or combinational logic.

* * * * *